US006657458B1

(12) United States Patent
Sharpe-Geisler

(10) Patent No.: US 6,657,458 B1
(45) Date of Patent: Dec. 2, 2003

(54) OUTPUT BUFFER WITH FEEDBACK FROM AN INPUT BUFFER TO PROVIDE SELECTABLE PCL, GTL, OR PECL COMPATIBILITY

(75) Inventor: Bradley A. Sharpe-Geisler, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/146,826

(22) Filed: May 16, 2002

(51) Int. Cl.[7] .......................................... H03K 19/177
(52) U.S. Cl. ............................ 326/41; 326/37; 326/63; 326/68; 326/83
(58) Field of Search .......................... 326/37, 41, 62, 326/63, 68, 82, 83, 86

(56) References Cited

U.S. PATENT DOCUMENTS

| 6,028,758 | A | 2/2000 | Sharpe-Geisler | 361/111 |
| 6,031,365 | A | 2/2000 | Sharpe-Geisler | 323/313 |
| 6,218,858 | B1 * | 4/2001 | Menon et al. | 326/39 |
| 6,377,069 | B1 * | 4/2002 | Veenstra et al. | 326/38 |

OTHER PUBLICATIONS

U.S. patent application Ser. No. 10/146,739, Sharpe–Geisler, filed May 16, 2002.
U.S. patent application Ser. No. 10/146,769, Sharpe–Geisler, filed May 16, 2002.
U.S. patent application Ser. No. 10/147,199, Sharpe–Geisler, filed May 16, 2002.
U.S. patent application Ser. No. 10/146,734, Sharpe–Geisler, filed May 16, 2002.
U.S. patent application Ser. No. 10/147,011, Sharpe–Geisler, filed May 16, 2002.
U.S. patent application Ser. No. 10/151,753, Sharpe–Geisler, filed May 16, 2002.

* cited by examiner

Primary Examiner—Anh Tran
(74) Attorney, Agent, or Firm—Fliesler Dubb Meyer & Lovejoy LLP

(57) ABSTRACT

An input/output buffer is provided with an output buffer portion which can be used to make an integrated circuit selectively compatible with one of a number of interface types, such as PCI, GTL, PECL, ECL and SSTI. An output buffer portion has an input for receiving an output signal node (D) where components on the integrated circuit provide an output signal for connecting to external circuits at an output pad (PAD). The signal from the PAD is further fed back through the input buffer portion which programmably set to operate in a PCI, PECL or GTL mode to control a node (INB). The node (INB) is used to control power switches driving the gates of CMOS buffer transistors to provide sufficient current for rapid switching, and limit current after switching to prepare for a subsequent output transition. Pull-up and pull-down reference circuits provide references VRFPU, VRFPPU, VRFPD and VRFPPD to control the current of the output during transition of the output, while maintaining the output voltage level at a desired voltage with minimal current level after transition.

14 Claims, 19 Drawing Sheets

PCI Mode

PCI Mode

GTL Mode

GTL Mode

PECL Mode

PECL Mode

US 6,657,458 B1

OUTPUT BUFFER WITH FEEDBACK FROM AN INPUT BUFFER TO PROVIDE SELECTABLE PCL, GTL, OR PECL COMPATIBILITY

CROSS-REFERENCE TO RELATED APPLICATIONS

The present application is related to the following patent applications, each of which is filed the same day as the present application, each of which names the same inventor named in the present application, and each of which is incorporated by reference in its entirety into the present application:

U.S. patent application Ser. No. 10/146,769, filed May 16, 2002, entitled "INPUT BUFFER WITH CMOS DRIVER GATE CURRENT CONTROL ENABLING SELECTABLE PCL, GTL, OR PECL COMPATIBILITY";

U.S. patent application Ser. No. 10/146,734, filed May 16, 2002, entitled "BAND GAP REFERENCE CIRCUIT";

U.S. patent application Ser. No. 10/147,199, filed May 16, 2002, entitled "OUTPUT BUFFER HAVING PROGRAMMABLE DRIVE CURRENT AND OUTPUT VOLTAGE LIMITS";

U.S. patent application Ser. No. 10/147,011, filed May 16, 2002, entitled "ELECTROSTATIC DISCHARGE PROTECTION CIRCUIT";

U.S. patent application Ser. No. 10/151,753, filed May 16, 2002, entitled "OUTPUT BUFFER WITH OVERVOLTAGE PROTECTION"; and U.S. patent application Ser. No. 10/146,739, filed May 16, 2002, entitled "INPUT BUFFER WITH SELECTABLE PCL, GTL, OR PECL COMPATIBILITY."

TECHNICAL FIELD

The present invention relates to an input/output buffer design capable of handling multiple types of signals. More particularly, the present invention relates to an output buffer capable of driving loads of different types of circuitry, such as Peripheral Component Interconnect (PCI) circuitry, Gunnings Transceiver Logic (GTL), Emitter Coupled Logic (ECL), Series Stub Terminated Logic (SSTL), or Pseudo Emitter Coupled Logic (PECL) to desired output levels.

BACKGROUND

Circuits constructed in accordance with standards such as PCI, GTL, ECL, SSTL or PECL each have different high and low state characteristics. Although some of the states for different circuit types will have similar voltage and current requirements, others will be different.

PCI provides a high speed bus interface for PC peripheral I/O and memory and its input and output voltage and current requirements are similar to CMOS. For instance, the high and low voltage states will vary from rail to rail (VDD to VSS), with high impedance low current inputs and outputs.

GTL provides a lower impedance higher current high state, providing a low capacitance output to provide higher speed operation. The transition region for GTL is significantly smaller than for CMOS.

PECL provides a high current low voltage to provide a smaller transition region compared to CMOS to better simulate emitter coupled logic (ECL). The PECL offers a low impedance outputs and a high impedance inputs to be the most suitable choice of logic to drive transmission lines to minimize reflections.

Integrated circuit chips, such as a field programmable gate array (FPGA) chip, or a complex programmable logic device (CPLD), provide functions which may be used in a circuit with components operating with any of the logic types, such as PCI, GTL, ECL, PECL, or SSTL described above. It would be desirable to have an input/output buffer for use on a general applicability chip such as a FPGA or CPLD to selectively make the chip compatible with any of these logic types.

SUMMARY

In accordance with the present invention, an input/output buffer circuit includes an output buffer which can selectively be made compatible with any of a number of logic types, such as PCI, GTL, or PECL.

In accordance with the present invention, the output buffer portion of the circuit includes an input signal node (D) where components on the integrated circuit provide an output signal for connecting to external circuits at an output pad (PAD). The signal from the PAD is further fed back through the input buffer circuit which is programmably set to operate in one of a GTL, PECL, or PCI operation modes to provide a signal to a node (INB). The node (INB), then, provides a signal to enable the output buffer to prepare for a rapid transition of the PAD after transition of the signal D in the desired GTL, PECL or PCI mode. The circuitry of the output buffer further provides necessary drive current to transition a load at a desired rate and to set output voltage limits, while limiting drive current after switching to enable a subsequent rapid output transition.

The output buffer portion includes CMOS transistors to drive the (PAD). The gates of the CMOS transistors are driven by switching circuitry to control the current and voltage levels of the pad during and after an input transition. The node (INB) is used to control the switching circuitry to limit the current provided, depending on the mode of operation, such as PCI, PECL, or GTL mode. Similarly, slew rate control is provided to programmably control current from switching circuitry.

Pull-up switching circuitry receives a reference VRFNPU to accurately control current provided to the gate of pull up CMOS transistor during transition of the output, while a reference VRFPU controls current provided to the gate of a pull up CMOS transistor after transition using a more limited current to clamp the output voltage to a desired value. Similarly, pulldown switching circuitry receives references VRFPD and VRFPPD to control current and limit voltage provided from the pull down CMOS transistor. The circuits providing references VRFPU, VRFNPU, VRFPD and VRFPPD include components replicating the components of the pull-up and pull-down switching circuitry with feedback to accurately control current and voltage on the output.

BRIEF DESCRIPTION OF THE DRAWINGS

Further details of the present invention are explained with the help of the attached drawings in which.

DETAILED DESCRIPTION

Figure 1A:
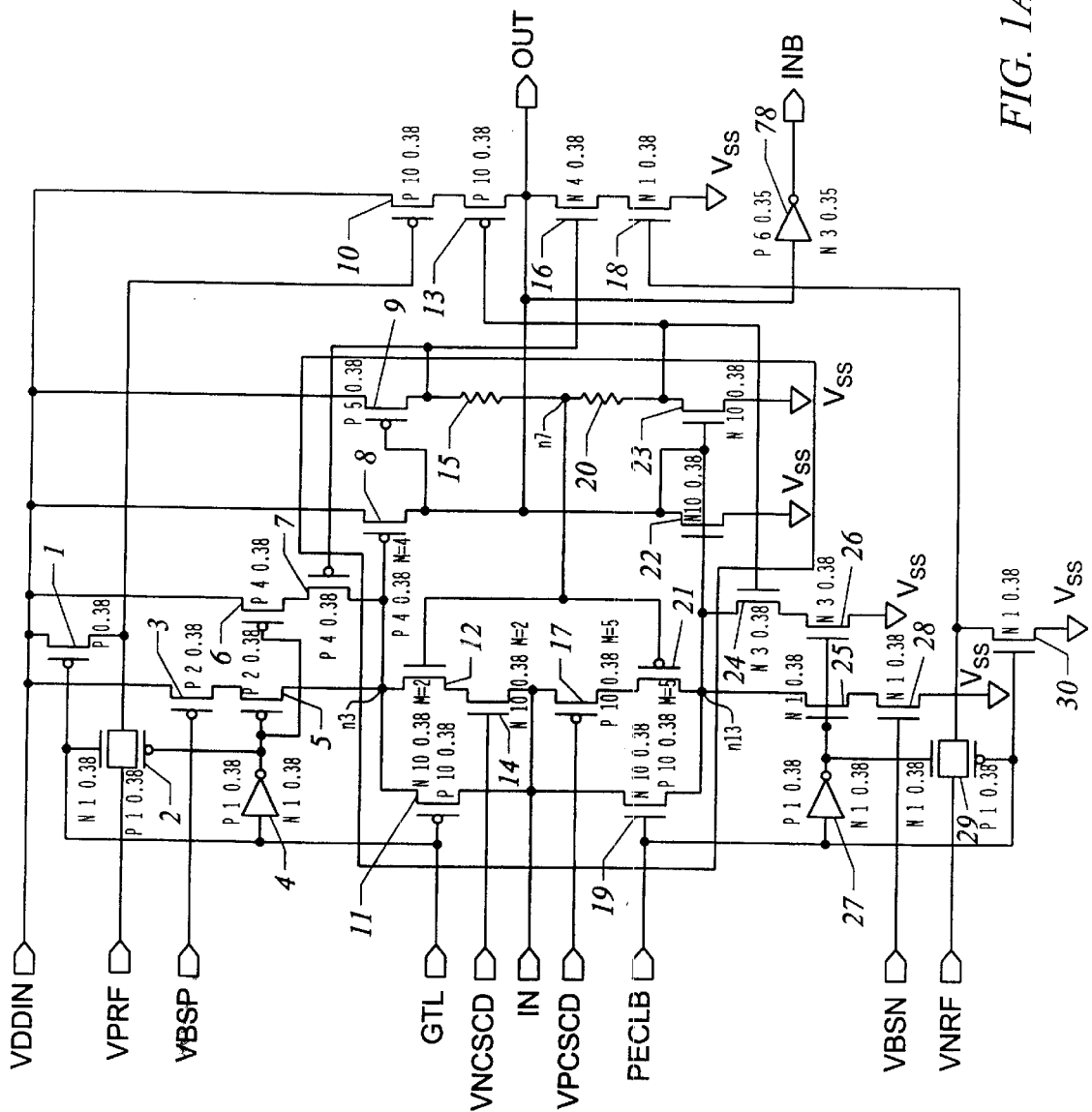
FIG. 1A an input portion of a first input/output buffer in accordance with the present invention.
Figure 1B:
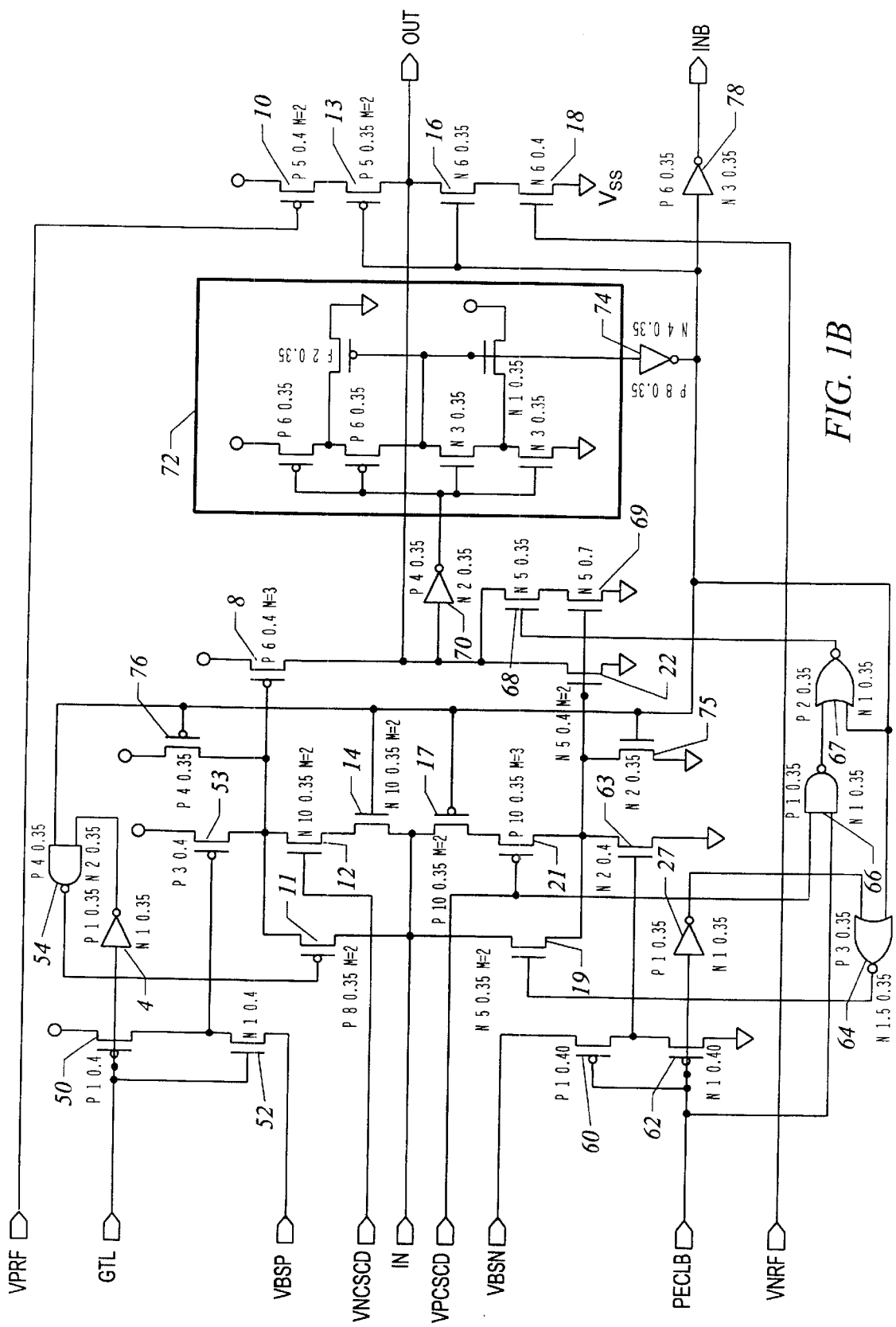
FIG. 1B shows an input portion of an input/output buffer in accordance with another embodiment of the present invention.
Figure 6A:
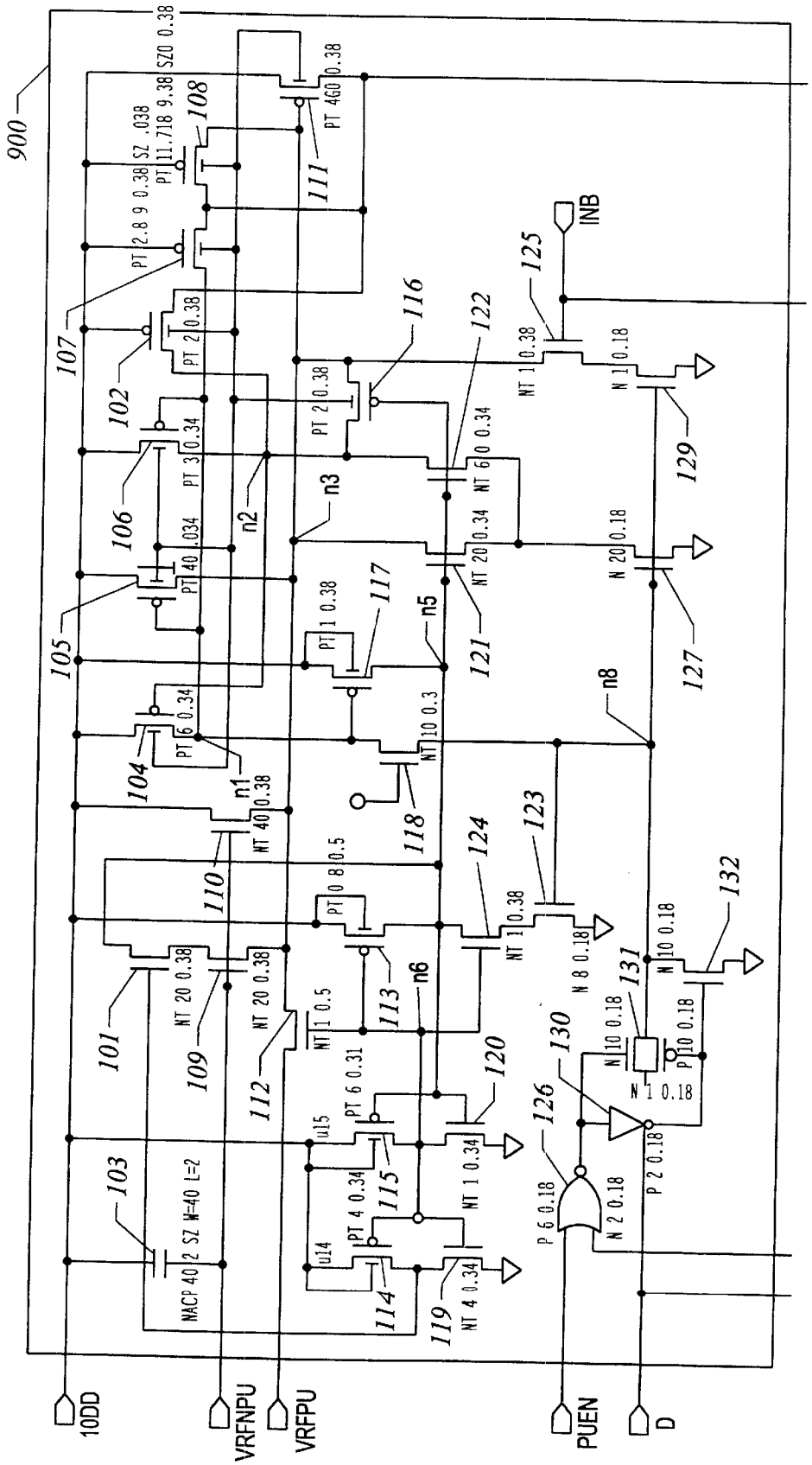
FIGS. 6A & 6B shows an output portion of the input/output buffer in accordance with the present invention.
Figure 6B:
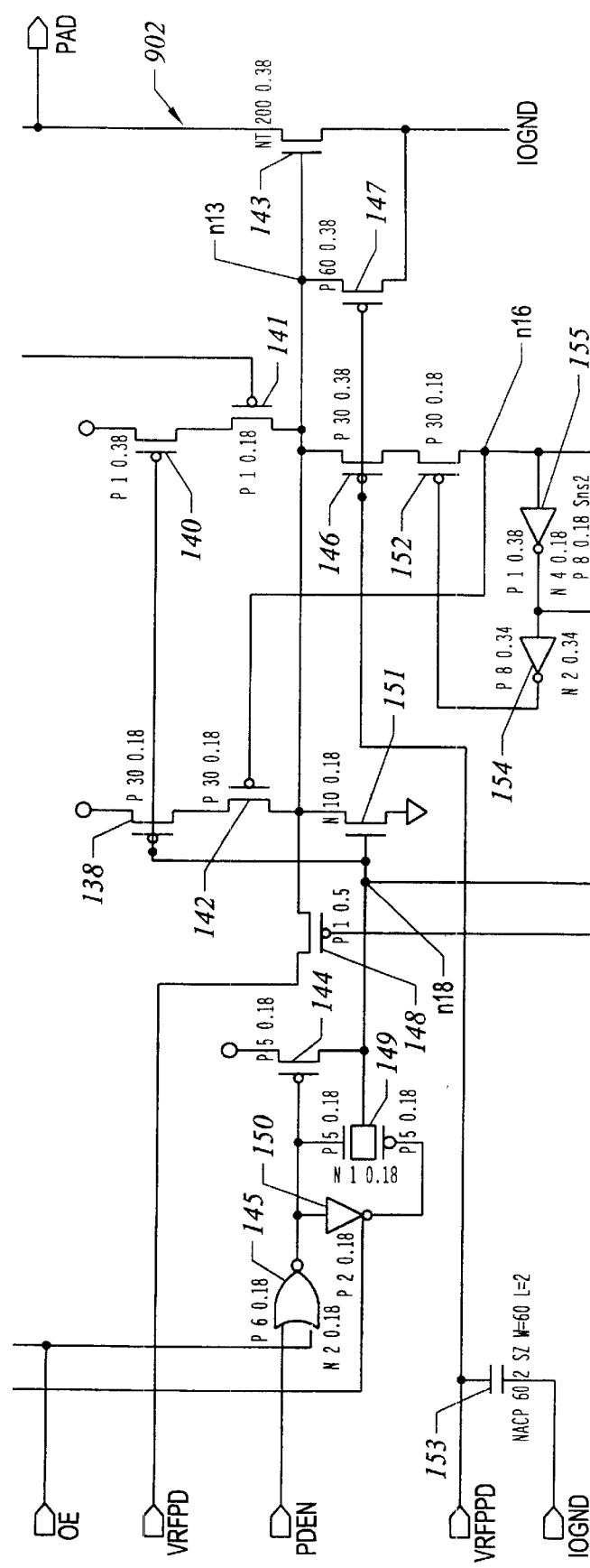
Figure 7A:
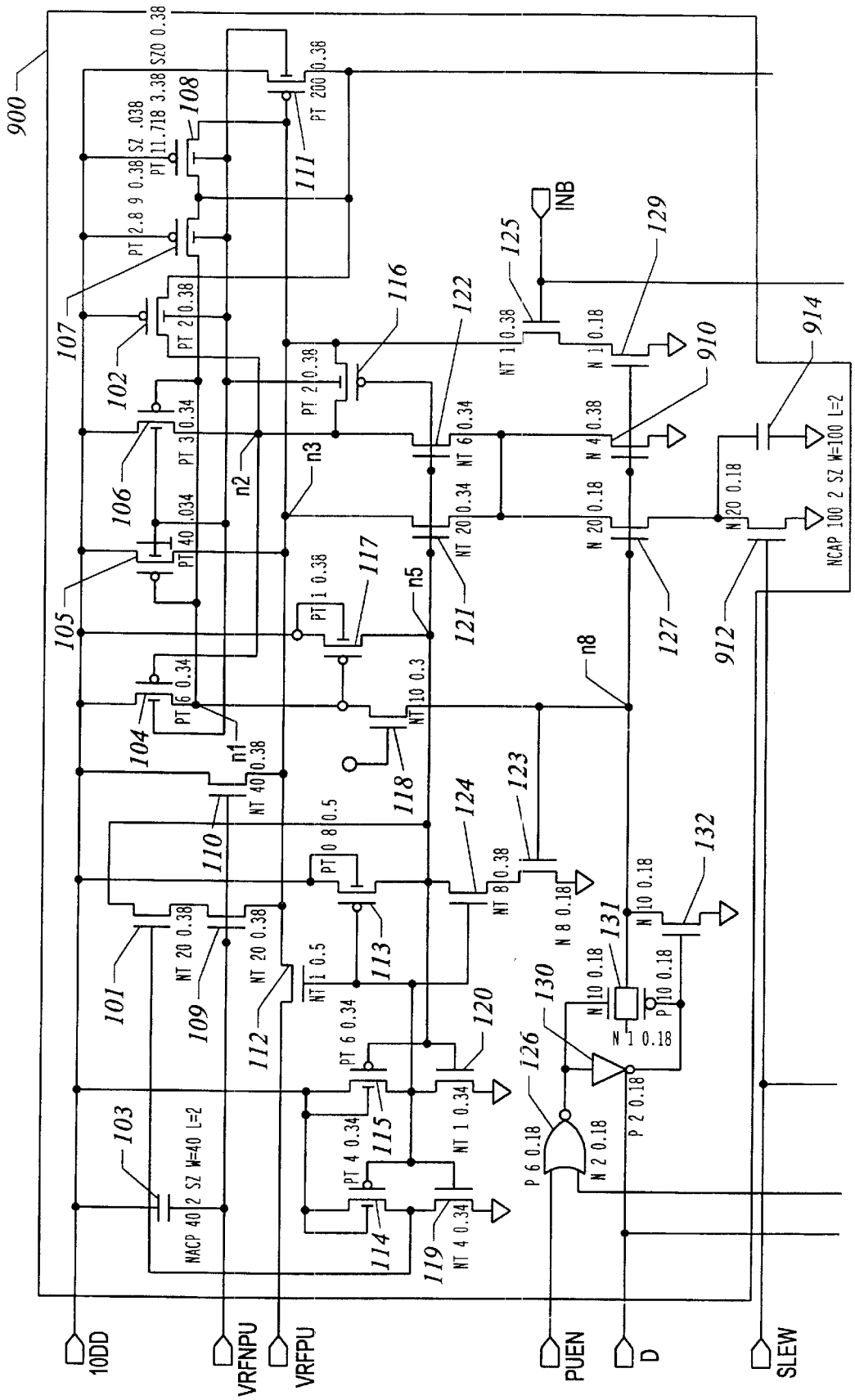
FIGS. 7A & 7B shows modifications to the output buffer circuit of FIG. 6 to provide slew rate control.
Figure 7B:
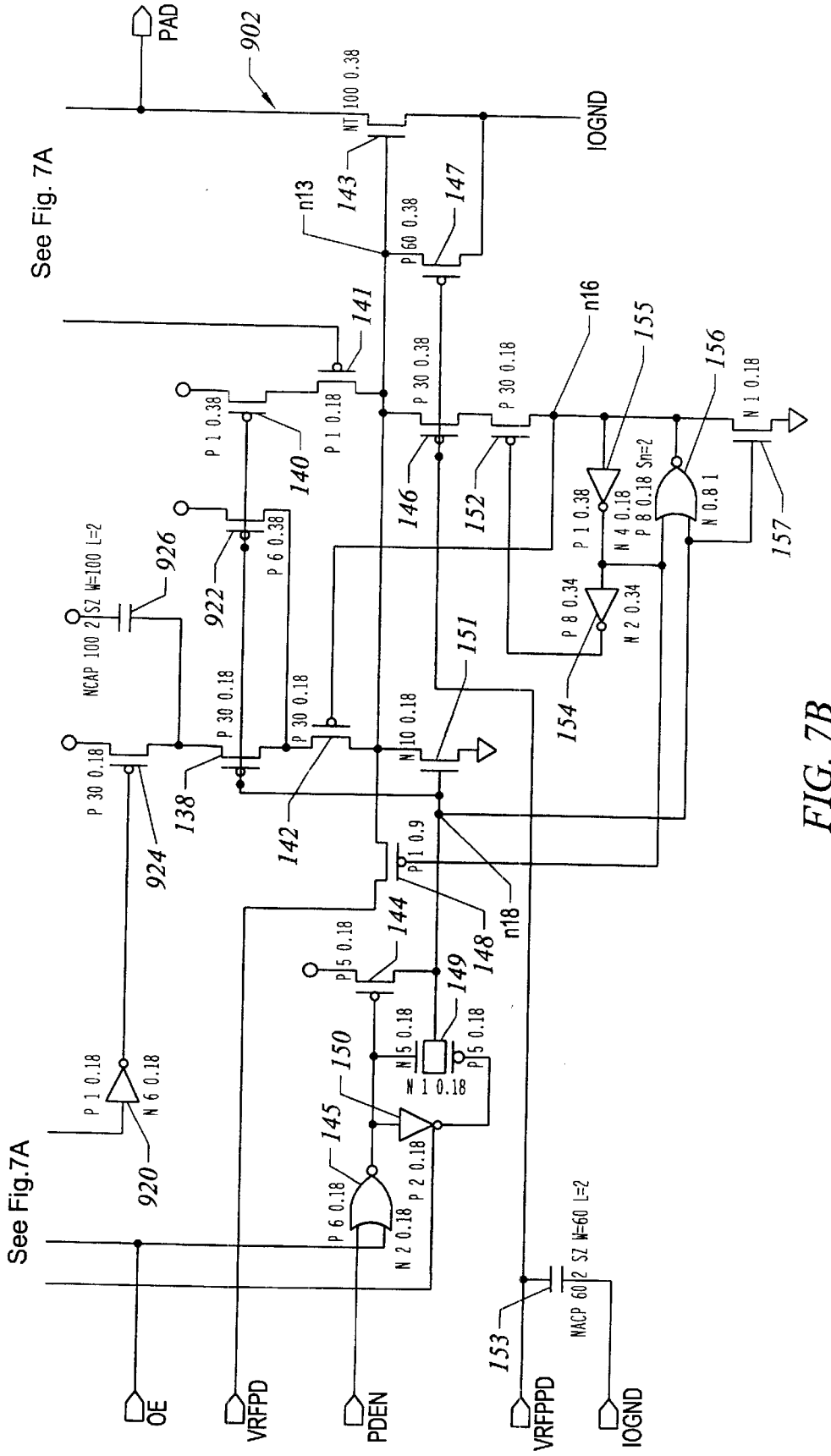

As indicated, the input/output buffer in accordance with the present invention includes an input buffer portion as shown in FIG. 1A or FIG. 1B and an output buffer portion as shown in FIG. 6 or 7. Further details of the input/output buffer design along with an operation description for the components are provided in sections to follow.

I. Input Buffer

An input buffer in accordance with an embodiment of the present invention is shown in FIG. 1A (and is discussed with reference to FIGS. 1A–4A and FIG. 5). An input buffer in accordance with another embodiment of the present invention is shown in FIG. 1B (and is discussed with reference to FIGS. 1B–4B). The circuits of FIGS. 1A and 1B receive an input signal IN and mode select signals GTL and PECLB, and operates to provide an output signal OUT depending on the input IN, with switching current dependent on mode signals GTL and PECLB states. The circuitry making up the input buffer of FIG. 1A is described first. Following this, is the description of the circuitry making up the input buffer of FIG. 1B.

A. Input Buffer Circuitry

The input buffer circuitry of FIG. 1A includes pull up pass transistors 8 and 13 for connecting the input buffer to the output node OUT. The circuitry further includes pull down pass transistors 22 and 16 for connecting the input buffer to the output OUT. An input signal is applied to the input buffer at input node IN. Mode select signals are applied at GTL and PECLB nodes to control switching circuitry to set whether the input node IN drives transistors 8 and 22 alone to switch the voltage and current on the output, OUT, or whether transistors are used to assist other transistors 8 and 22 to increase switching current and voltage.

In FIG. 1A as well as subsequent figures, transistors with the gate circle, such as the transistors 8 and 13, are PMOS devices, while transistors without the gate circle, such as the transistor 16 are NMOS devices. Further, the transistor device type is indicated by a P or N followed by the transistor length and width in microns. The indication m=5 after a transistor indicates 5 transistors of identical size are connected in parallel. Although specific transistor sizes are shown, other sizes may be utilized depending on specific user design requirements. Components carried over from FIG. 1A into subsequent figures are similarly labeled.

The GTL and PECLB mode select nodes are preferably connected to memory cells. The memory cells can then be programmed to control the desired operation mode of the cells. Alternatively, the GTL and PECLB signals can be controlled by logic, or voltages applied external to the input buffer by a user.

The pull up transistor 8 has a source-drain path directly connecting power supply terminal or node VDD to the output OUT, and the pull down transistor 22 has a source-drain path directly connecting power supply terminal or node VSS to the OUT. The input IN can be applied to control transistors 8 and 22 alone to maximize the range of current or voltage on the output OUT.

The pull up transistor 13 has a source-drain path connected in series with transistor 10 to connect VDD to the output node OUT. The gate of transistor 10 is coupled to a PMOS reference voltage terminal VPRF which limits the voltage and current provided to the output node OUT from transistor 13. Similarly, the pull down transistor 16 has a source-drain path connected in series with transistor 18 to connect VSS to the output OUT. The gate of transistor 18 is connected to an NMOS reference voltage terminal VNRF which limits the voltage and current provided to the output OUT from through transistor 16.

Transistors 10, 13, 16, and 18 form a first buffer operable to couple (i.e., couple or decouple) the power supply terminal VDD and the power supply terminal VSS to the output node OUT. Whether such coupling occurs depends upon the nature of signals applied to the mode select nodes and of the input signal applied to the input node. In this context, "and" should be understood to mean either or both supply terminals may be coupled to the output node. Similarly, transistors 8 and 22 form a second buffer operable to couple the power supply terminal VDD and the power supply terminal VSS to the output node. The first and second buffers are thus operable in response to a set of mode select signals applied to switching circuits and an input signal applied to the input node IN to couple the first and second power supply terminals to the output node. The switching circuits act to enable the buffers to be coupled to the power supply terminals if and when an appropriate input signal is present.

B. Input Buffer Operation

The GTL and PECL signals can be varied for the circuitry of FIG. 1A to create at least three operation modes, a PCI mode, a GTL mode, and a PECL mode. Further details of components of FIG. 1A and operation with these modes is described to follow.

1. PCI Mode

Figure 2A:
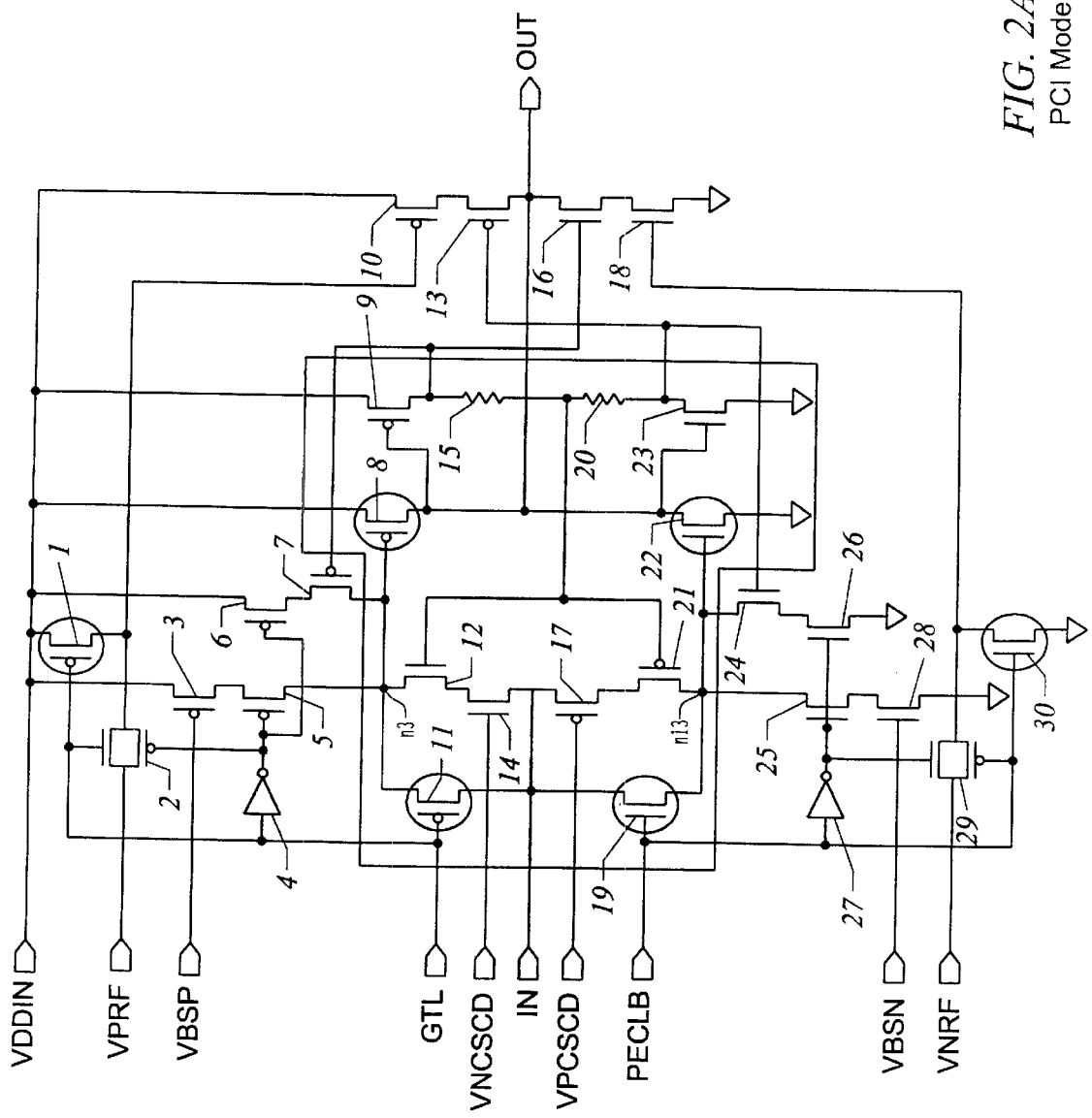
FIG. 2A shows active transistors from FIG. 1A in a PCI mode.

The simplest mode is the PCI mode, which is selected when GTL is low and PECLB is high. FIG. 2A shows the active transistors in the PCI mode which include the pull up transistor 8 and pull down transistor 22—which directly drive the output connection 'OUT' from the VSS and VDD voltage rails. The gates of the inverter transistor 8 and 22 are coupled to the input 'IN' through pass transistors 11 and 19 which are further activated by the GTL and PECL signals.

The GTL signal being low deactivates pass transistors 2 to disconnect VPRF from transistor 10, and transistor 1 is turned on by the GTL signal to apply VDD to the gate of transistor 10. Transistor 10 is, thus, turned off so that pull up transistor 13 will have no effect on the output OUT.

The PECL signal being high deactivates pass transistors 29 to disconnect VNRF from transistor 18, and transistor 30 is turned on by the PECL signal to apply VSS to the gate of transistor 18. Transistor 18 is, thus, turned off so that pull down transistor 16 will have no affect on the output OUT.

Thus, in the PCI mode transistors 8 and 22 drive the output OUT without the assistance of transistors 13 or 16 to provide less current for switching to pull up or pull down the output OUT.

2. GTL Mode

Figure 3A:
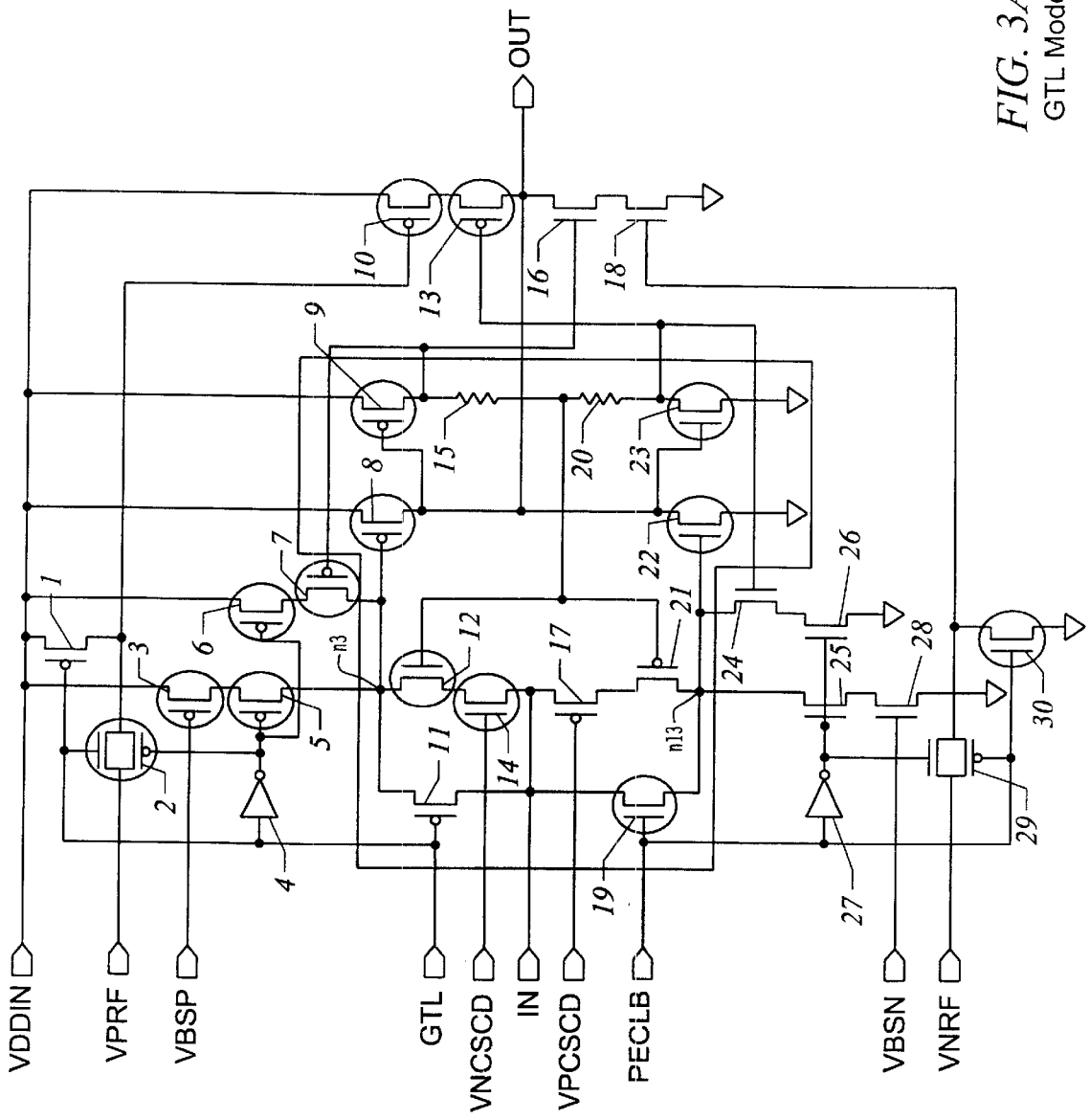
FIG. 3A shows active transistors from FIG. 1A in a GTL mode.

The GTL mode is selected when GTL and PECL are both high. FIG. 3A shows the active transistors in GTL mode which include the pull down transistor 22 with the pull down transistor 16 deactivated as in the PCI mode. As with the PCI mode, with PECL high, transistor 19 is on to pass IN to the gate of transistor 22, while pass transistor 29 is off and transistor 30 is on to connect the gate of transistor 18 to ground to turn it off. Transistor 22, thus, acts without transistor 16 to connect the output OUT directly to the VSS rail when the input IN is high.

Unlike with the PCI mode, pull up transistor 8 now acts in conjunction with pull up transistor 13 to pull up the output OUT when IN is high since the signal GTL is high. With GTL high, transistor 11 is off disconnecting the direct connection of IN to the gate of transistor 8 so that transistor 8 can be turned on only to assist transistor 13 in pulling up the output OUT. The transistor 13, then finishes pulling up the output OUT with transistor 8 turned off to limit the current and voltage on the output OUT.

With GTL high, the pass gate 2 is on. Further, the transistors 3 and 5 with series source-drain paths are activated by the inverter 4 to pull up node n3. Similarly, transistor 6 and 7 with series connected source-drain paths are also activated by the inverter 4 to pull up node n3. A cascode transistor 14 which has a source connected to the input IN will, thus, be active to discharge or charge node n3 through transistor 12. The cascode transistor 14 is connected with a reference voltage VNC applied to its gate, so that the transistor will be turned on or off with a significant amount of gain by the source signal IN applied.

With the switching transistors activated as shown in FIG. 3A, the circuit operates as described as follows with IN being high or low, or transitioning between high and low.

When IN goes high, cascode transistor 14 is off which blocks the only pull down path for node n3. Node n3 is then pulled high by transistors 3 and 5 shutting off transistor 8. Also node n13 will be pulled high through transistor 19 to turn on transistor 22. Transistor 22 is strong enough to overcome transistors 10 and 13 which are on. A reference voltage VPRF applied to the gate of transistor 10 will set the threshold where transistor 10 will turn off allowing OUT to go low. When OUT goes low, transistor 9 turns on and transistor 23 turns off which pulls up node n7. With node n7 high, transistors 7 and 13 turn off to reduce power consumption and transistor 12 turns on to prepare for IN transitioning back low.

When IN transitions from high to low, node n13 will be pulled low through transistor 19 to turn off transistor 22. Cascode transistor 14 will turn on to pull down node n3. The voltage reference VNCSCD sets the threshold voltage where cascode transistor 14 turns on. The cascode 14 turning on overcomes current from series transistors 3 and 5, so transistor 8 will turn on to pull OUT high. A reference voltage VBSP sets current in transistors 3 and 5. When OUT goes high, transistor 9 will turn off and transistor 23 will turn on to pull node n7 low. Node n7 being low turns off transistor 12 and turns on transistor 7. Transistors 6 and 7 being on pull up node n3 getting it ready for a next high to low transition. Resistor 20 is sized so that even with a slow slewing input, transistor 13 will turn on before either transistor 12 turns off or transistor 7 turns on which assists in pulling OUT high to square the signal.

3. PECL Mode

Figure 4A:
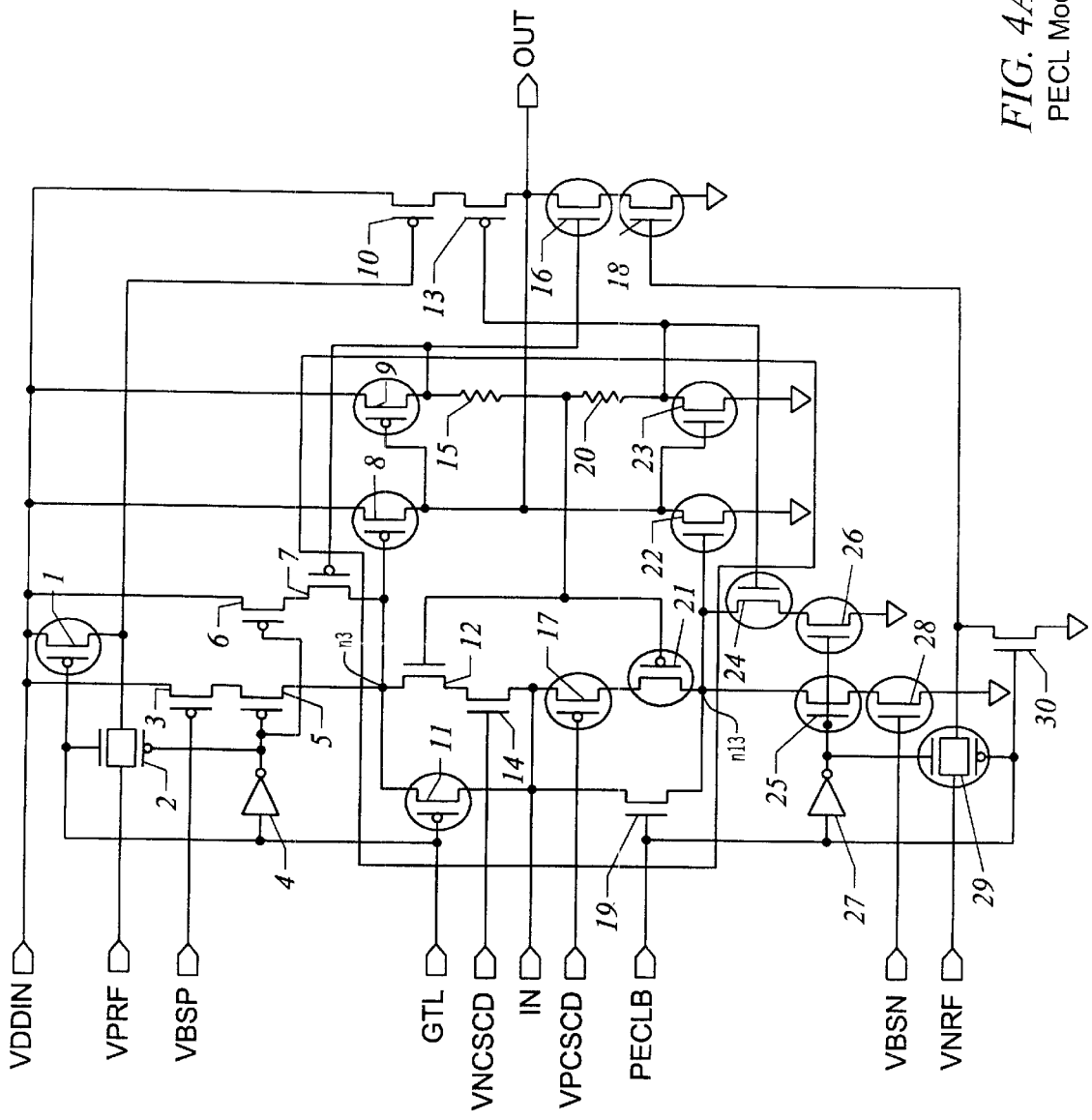
FIG. 4A shows active transistors from FIG. 1A in a PECL mode.

PECL mode is selected when GTL and PECL are both low. FIG. 4A shows the active transistors in PECL mode which include pull up transistor 8 with the pull up transistor 13 deactivated as in the PCI mode. As with the PCI mode and unlike the GTL mode, with GTL low, transistor 11 is on to pass IN to the gate of transistor 8, while pass transistor 2 is off and transistor 1 is on to connect the gate of transistor 10 to VDD to turn if off. Transistor 8, thus, acts without transistor 13 to connect the output OUT directly to the VDD rail when the input IN is low.

Unlike both the PCI mode and GTL mode, pull down transistor 22 now acts in conjunction with pull down transistor 16 to pull the output OUT to VSS when IN is high since the signal PECL is low. With PECL low, transistor 19 is off disconnecting the direct connection of IN to the gate of transistor 22 so that transistor 22 can be turned on only to assist transistor 16 in pulling down the output OUT. The transistor 16, then finishes pulling down the output OUT with transistor 22 turned off to limit the current and voltage on the node OUT.

With PECL low, the pass gate 29 is on. Further, the transistors 13 and 28 with series source-drain paths are activated by the inverter 27 to pull down node n13. Similarly, transistors 24 and 26 with series connected source-drain paths are also activated by the inverter 27 to pull down node n13. A cascode transistor 17 which has a source connected to the input IN will, thus, be active to discharge or charge node n13 through transistor 21. The cascode transistor 17 is connected with a reference voltage VPC applied to its gate, so that the transistor will be turned on or off with a significant amount of gain by the source signal IN applied.

With the switching transistors activated as shown in FIG. 4A, the circuit operates as described as follows with IN being high or low, or transitioning between high and low.

When IN goes low, cascode transistor 17 is off which blocks the only pull up path for node n13. Node n13 is then pulled low by transistors 25 and 28. With node n13 low, transistor 22 will turn off. With IN going low, node n3 will be pulled low through transistor 11 and transistor 8 will turn on to pull OUT high. Transistor 8 is strong enough to overcome transistors 16 and 18. A reference voltage VNRF applied to the gate of transistor 18 sets the threshold where transistor 18 will turn off and OUT goes high. When OUT goes high, transistor 9 turns off and transistor 23 turns on to pull down node n7. With node n7 low, transistors 24 and 16 will turn off to reduce power consumption, and transistor 21 will turn on to prepare for IN later transitioning to high.

In a low to high transition of IN, node n3 is pulled high through transistor 11, thus turning off transistor 8, while cascode transistor 17 turns on. The voltage reference VPCSCD sets the threshold where cascode transistor 17 turns on. Cascode transistor 17 turning on pulls up node n13 to overcome current from transistors 25 and 28. Reference voltage VBSN sets current in transistors 25 and 28. Node n13 being high turns on transistor 22 to pull OUT low. When OUT goes low, transistor 9 will turn on and transistor 23 will turn off to pull node n7 high. Node n7 being high turns on transistors 16 and 24, and turns off transistor 21. Transistor 21 turning off blocks the IN signal from node n13, so transistor 24 turning on pulls down node n13 getting it ready for the next low to high transition. Transistor 16 turning on holds OUT low since node n13 going low will turn off transistor 22. Resistor 15 is sized so that even with a slow slewing input, transistor 16 will turn on before either transistor 21 turns off or transistor 24 turns on to assist in pulling OUT low, thus squaring the signal.

C. Reference for Input Buffer

Figure 4B:
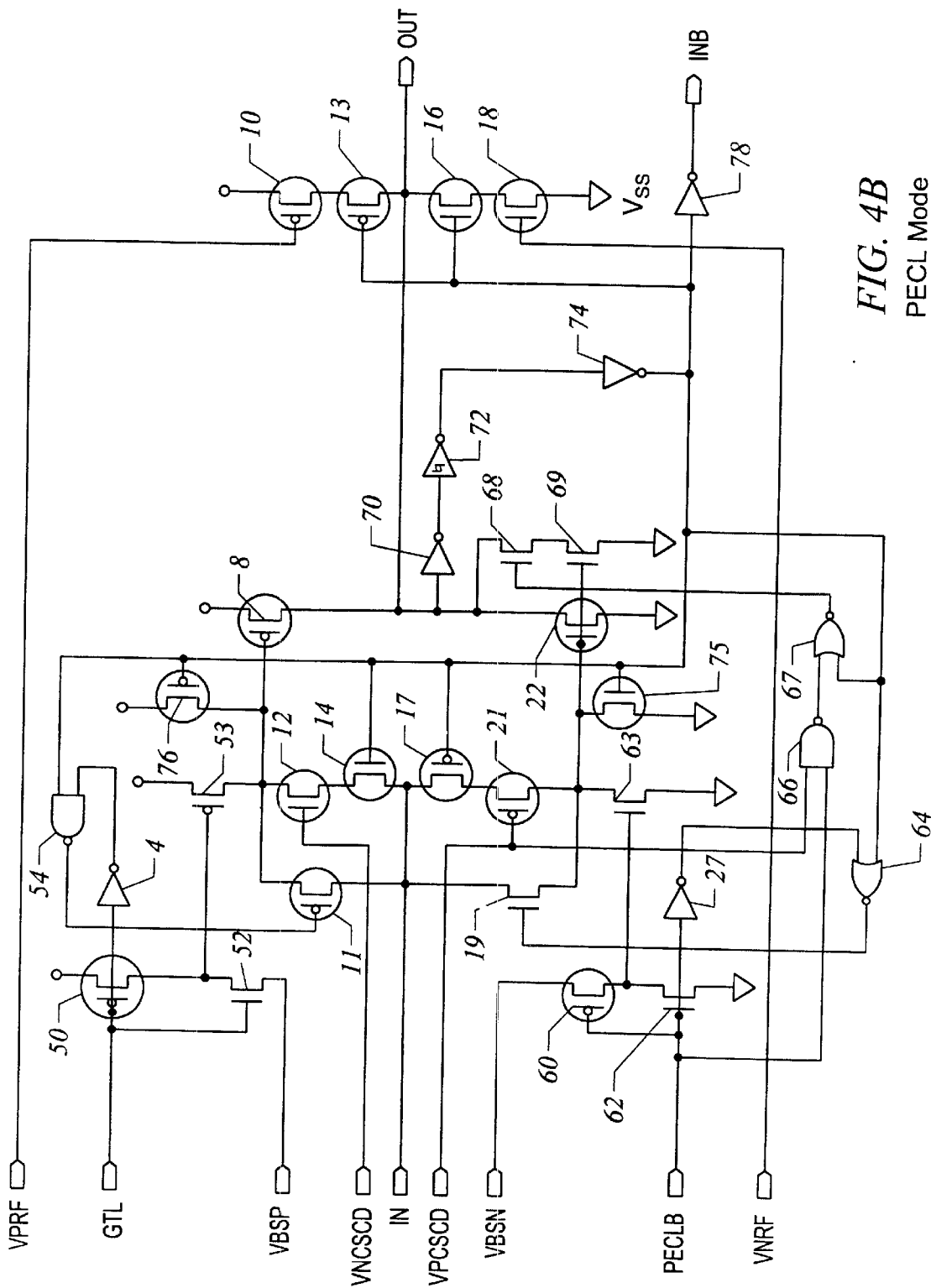
FIG. 4B shows active transistors from FIG. 1B in a PECL mode.
Figure 5:
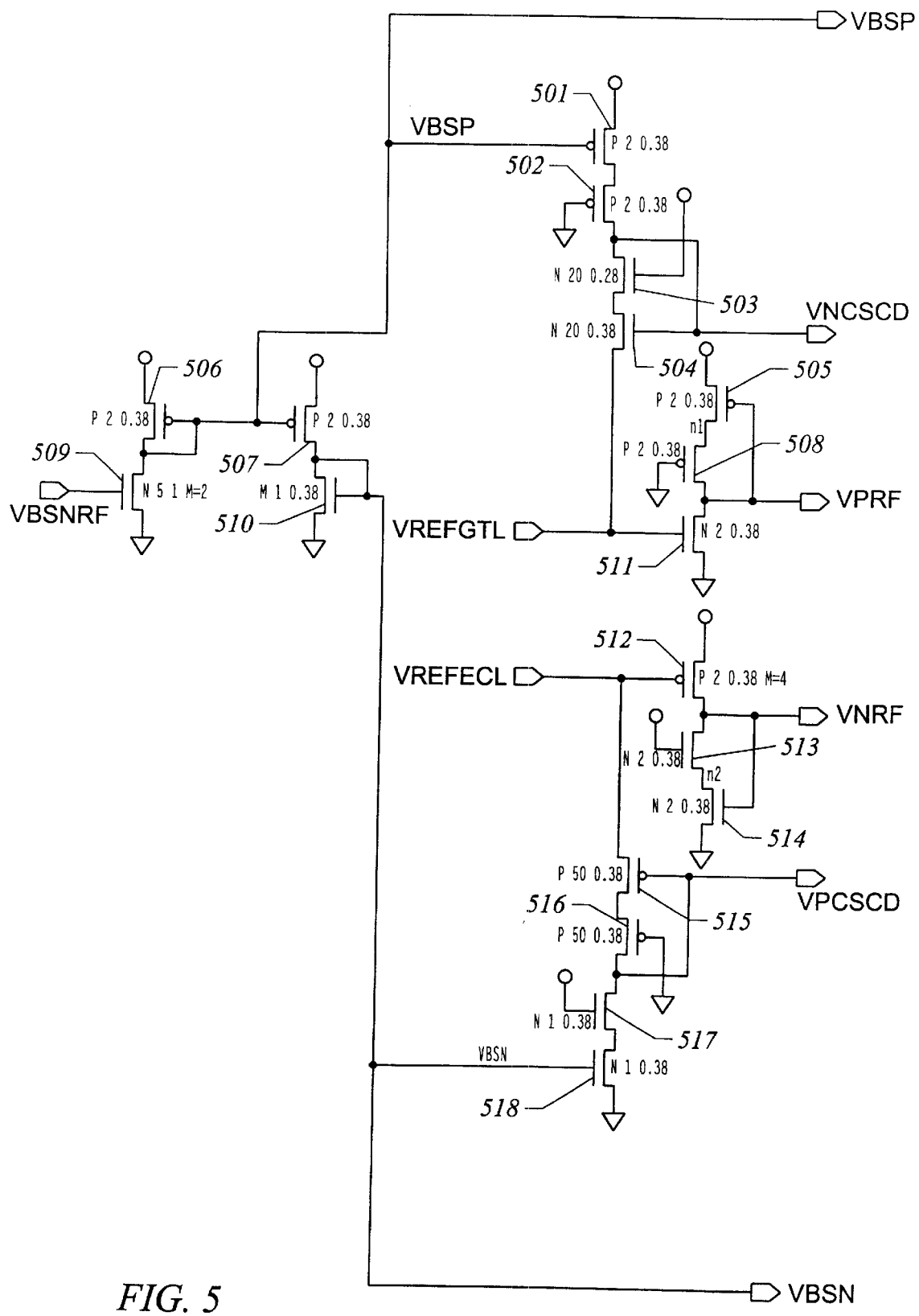
FIG. 5 shows circuitry for providing the voltage references to the input buffer circuitry of FIGS. 1A–4A.

FIG. 5 shows circuitry for providing the reference voltages VNCSCD, VPRF, VNRF and VPCSCD for the input buffer circuits shown in FIGS. 1A–4A.

To provide the references VNCSCD, VPRF, VNRF and VPCSCD, initial reference voltages of VBSP and VBSN are generated. The circuit of FIG. 5 initially includes a current mirror formed by PMOS transistors 506 and 507 to serve in generating VBSP and VBSN. The sources of transistors 506 and 507 are connected to VDD. A reference VBSP is formed by the connection of the common gates of transistors 506 and 507. The drain and gate of transistor 506 are connected through an NMOS transistor 509 to VSS. The voltage VBSNRF is applied to the gate of transistor 509, with VBSNRF set to just turn on transistors 506 and 509 so that only a weak current is drawn. With VBSNRF applied to transistor 509, the voltage at VBSP will be the minimal PMOS transistor voltage needed to turn transistor 506 in series with transistor 509. The drain of transistor 507 is connected through an NMOS transistor 510 to VSS. The gate and drain of transistor 510 form the voltage reference VBSN. With VBSP applied to the gate of transistor 507, and VBSP being a minimal voltage to turn on transistors 506 and 509, since transistors 506 and 507 form a current mirror with equal sized transistors, and transistor 510 is smaller than 509, the reference VBSN will be a voltage slightly larger than VBSNRF as needed to turn on transistor u10 to a degree to draw an equal current with transistor 509.

The reference VPRF is applied to the gate of transistor 10 in FIGS. 1A–4A to turn on transistor 10 to a desired level below VDD to provide a desired GTL high voltage level at the output. VREFGTL applied to the gate of transistor u11 is a low input designed to apply to the gate of an NMOS transistor to create an NMOS drain voltage of VPRF. The reference VPRF is further provided to the gate of PMOS transistor 505 which connects VDD to the source of a PMOS transistor 508 which has a gate connected to ground and a drain connected in common with transistor 511. The transistors 505 and 508 provide replicas of transistors 10 and 13, and VREFGTL assures the voltage at the drain of transistor u11 is at a desired VPRF value. With VPRF controlling the gate of both transistors 505 and 10, and transistors 505 and 508 replicating transistors 10 and 13, the voltage at the drain of transistor 13 will be the desired GTL high voltage.

The reference VNCSCD is applied to the gate of transistor 14 of FIGS. 1A–4A to assure a voltage is applied to the gate of transistor 8 to create a GTL high during a low to high transition of the output OUT by transistor 8. Transistors 501–504 in FIG. 5 replicate respective transistors 3, 5, 12 and 14 of FIGS. 1A–4A. The voltage VREFGTL is applied to the source of transistor u4 replicating a desired GTL input low level at the input IN in FIGS. 1A–4A. The gate of transistor 504 and drain of transistor 503 are tied together to provide the reference VNCSCD. VNCSCD is then applied to the gate of transistor 14 of FIGS. 1A–4A, and with transistors 501–504 replicating the conditions of transistors 3, 5, 12 and 14 VNCSCD assures the voltage passed by cascode transistor 14 is at a desired level to generate a GTL high from transistor 8 at the output OUT.

The reference VNRF is applied to the gate of transistor 18 in FIGS. 1A–4A to turn on transistor 18 to a desired level above VSS to provide a desired PECL low voltage level at the output. VREFECL applied to the gate of transistor 512 is an input designed to apply to the gate of a PMOS transistor to create a PMOS drain voltage of VNRF. The reference VNRF is further provided to the gate of NMOS transistor 514 which connects the source of NMOS transistor 513 to VSS. Transistor 513 has a gate connected to VDD and a drain connected in common with transistor 512. The transistors 513 and 514 provide replicas of transistors 16 and 18, and VREFECL assures the voltage at the drain of transistor u11 is at a desired VPRF value. With VPRF controlling the gate of both transistors 514 and 18, and transistors 513 and 514 replicating transistors 16 and 18, the voltage at the drain of transistor 18 will be the desired PECL low voltage.

The reference VPCSCD is applied to the gate of transistor 17 of FIGS. 1A–4A to assure a voltage is applied to the gate of transistor 22 to create a PECL low during a high to low transition of the output OUT by transistor 22. Transistors 515–518 in FIG. 5 replicate respective transistors 17, 21, 25 and 28 of FIGS. 1A–4A. The voltage VREFECL is applied to the source of transistor 515 replicating a desired PECL input level at the input IN in FIGS. 1A–4A. The gate of transistor u15 and drain of transistor 516 are tied together to provide the reference VPCSCD. VPCSCD is then applied to the gate of transistor 17 of FIGS. 1A–4A, and with transistors 515–518 replicating the conditions of transistors 17, 21, 25 and 28 VPCSCD assures the voltage passed by cascode transistor 17 is at a desired level to generate a PECL low from transistor 22 at the output OUT.

II. Input Buffer

The input buffer in accordance with the embodiment of the present invention shown in FIG. 1B will now be discussed. The circuits of FIG. 1B receives an input signal IN and mode select signals GTL and PECLB nodes, and operates to provide an output signal OUT depending on the input IN, with switching current dependent on mode signals GTL and PECLB states.

The circuit of FIG. 1B includes pull up pass transistors 8 and 13 for connecting the input buffer to the output OUT. The circuit further includes pull down pass transistors 22 and 16 for connecting the input buffer to the output OUT. An input signal is applied to the input buffer at input node IN. Mode select signals are applied at GTL and PECLB nodes to control switching circuitry to set whether the input node IN drives transistors 8 and 22 alone to switch the voltage and current on the output, OUT, or whether transistors are used to assist transistors 8 and 22 to increase switching current and voltage.

In FIG. 1B, as well as subsequent figures, transistors with the gate circle, such as the transistors 8 and 13, are PMOS devices, while transistors without the gate circle, such as the transistor 16 are NMOS devices. Further, the transistor device type is indicated by a P or N followed by the transistor length and width in microns. An indicator m=5 next to a transistors indicates that 5 transistors of the same size are connected in parallel. Although specific transistor sizes are shown, other sizes may be utilized depending on specific user design requirements.

The GTL and PECLB mode selection nodes are preferably connected to memory cells. The memory cells can then be programmed to control the desired operation mode of the cells. Alternatively, the GTL and PECLB signals can be controlled by logic, or voltages applied external to the input buffer by a user.

The pull up transistor 8 has a source-drain path directly connecting VDD to the output OUT, and the pull down transistor 22 has a source-drain path directly connecting VSS to the output OUT. The input IN can be applied to control transistors 8 and 22 alone to maximize the range of current or voltage on the output OUT.

The pull up transistor 13 has a source-drain path connected in series with transistor 10 to connect VDD to the output OUT. The gate of transistor 10 is coupled to a PMOS reference VPRF which limits the voltage and current provided to the output OUT from transistor 13. Similarly, the pull down transistor 16 has a source-drain path connected in series with transistor 18 to connect VSS to the output OUT. The gate of transistor 18 is connected to an NMOS reference VNRF which limits the voltage and current provided to the output OUT through transistor 16.

A. Input Buffer

The GTL and PECL signals can be varied for the circuitry of FIG. 1B to create at least three operation modes, a PCI mode, a GTL mode, and a PECL mode. Components of FIG. 1B and operation with these modes is described to follow.

1. PCI Mode

Figure 2B:
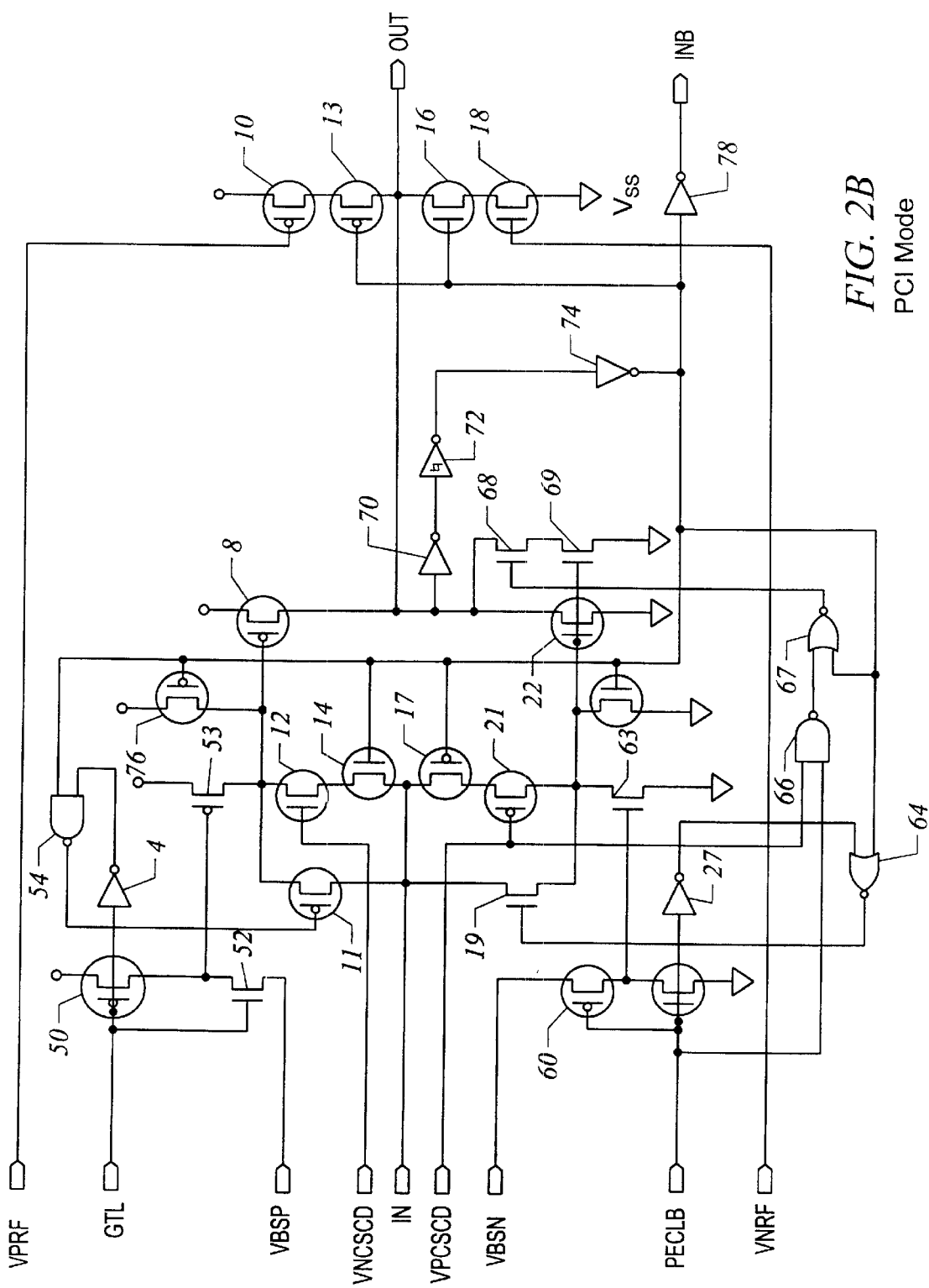
FIG. 2B shows active transistors from FIG. 1B in a PCI mode.

The PCI mode is selected when GTL is low and PECLB is high. FIG. 2B shows the active transistors in the PCI mode. Transistors carried over from FIG. 1B to FIG. 2B are similarly labeled, as will be components carried over in subsequent figures.

With GTL low, transistor 52 turns off and transistor 50 turns on to pull the gate of transistor 53 high. Transistor 53 will, thus, be off. With PECL high, transistor 60 turns off and transistor 62 turns on to pull the gate of transistor 63 high. Transistor 63 will, thus, be off.

With GTL low, the output of inverter 4 will provide a high signal to the input of NAND gate 54. The second input of the NAND gate 54 is connected to node n16 which holds the previous state of the input IN for a short time after any transition of the input IN. The node n16 will transition after a change in the input signal IN drives the output OUT to transition, and inverters 70, 74 and Schmitt trigger 72 transition. The Schmitt trigger has a hysteresis set as desired to assure the output signal is squared. Since the first input to the NAND gate is high, or a 1 with inverter 4 output high, the NAND gate 54 effectively provides a delayed signal IN on node n16 to the gate of transistor 11.

Transistor 11 will, thus be on to connect the signal IN directly to the gate of transistor 8 when IN is high, and during a high to low transition of IN.

Transistor 14 which has a gate connected to node n16, will, will like transistor 11, likewise be on when IN is high and during a high to low transition of IN, enabling IN to further be connected to the gate of transistor 8 through transistors 12 and 14. With IN directly driving transistor 8, through transistor 11, and transistors 12 and 14, a high to low transition will more rapidly increase current from the drain of transistor 8, than with a connection of IN through transistors 14 and 12 alone. During a low to high transition of IN, transistors 11 and 14 will both be off and the gate of transistor 8 will remain low until node n16 is later transitioned to turn on transistor 76, a condition creating a high impedance input.

With PECL high, the output of inverter 27 will provide a low signal to the input of NOR gate 64. The second input of the NOR gate 64 is connected to node n16 which provides a delayed state of the input IN. Since the first input to the NOR gate is low, or a 0, the NOR gate 64 effectively provides the inverse of delayed state of IN from node 16 to the gate of transistor 19. Transistor 19 will, thus be on to connect the signal IN directly to the gate of transistor 8 when IN is low, and during a low to high transition of IN. Transistor 17, which has a gate connected to node n16, will likewise be on when IN is low and during a low to high transition, since n16 will be low, enabling IN to further be connected to the gate of transistor 22 through transistors 17 and 21.

With IN directly driving transistor 22, through transistor 19, and transistors 17 and 21, a low to high transition will occur more rapidly with more current flowing, than with a connection of IN through transistors 17 and 21 alone. During a high to low transition of IN, transistors 19 and 17 will both be off and the gate of transistor 22 will remain low until node n16 is later transitioned to turn on transistor 22, a condition creating a high impedance input.

With PCL high, also a first input to NAND gate 66 will be high. With a second input of NAND gate 66 provided from the VPC reference, its output will be low, making a first input to NOR gate 67 low. The second input to NOR gate 67 is connected to node n16, so the output of NOR gate 67 will be active to provide the inverse of a delayed state of IN from node 16 to the gate of transistor 68. NOR gates 64 and 67 will, thus, act together during a low to high transition so that transistor 19 will be on to drive the gate of both transistors 22 and 69 which will act in parallel to sink additional current to rapidly pull down the output OUT. During a high to low transition of the input IN, the NOR gate 67 will provide a low output turning transistor 19 off, and transistor 22 will act without the assistance of transistor 69.

Thus, in the PCI mode during low to high transitions of the input IN, the input IN is applied to the transistor 8 both through switching transistor 11 and cascode transistor 12 to maximize pull up current. During a low to high transition of the input IN, IN is further applied to the transistor 22 through switching transistor 19 and cascode transistor 21 to maximize pull down current. After transition of the inverter formed by transistors 8 and 22, inverters 70 and 74 and Schmitt Trigger 72 will transition to turn off respective transistors 8 and 22 driving the output OUT current, and turn on respective transistors 13 and 16 to maintain the output OUT signal state.

2. GTL Mode

Figure 3B:
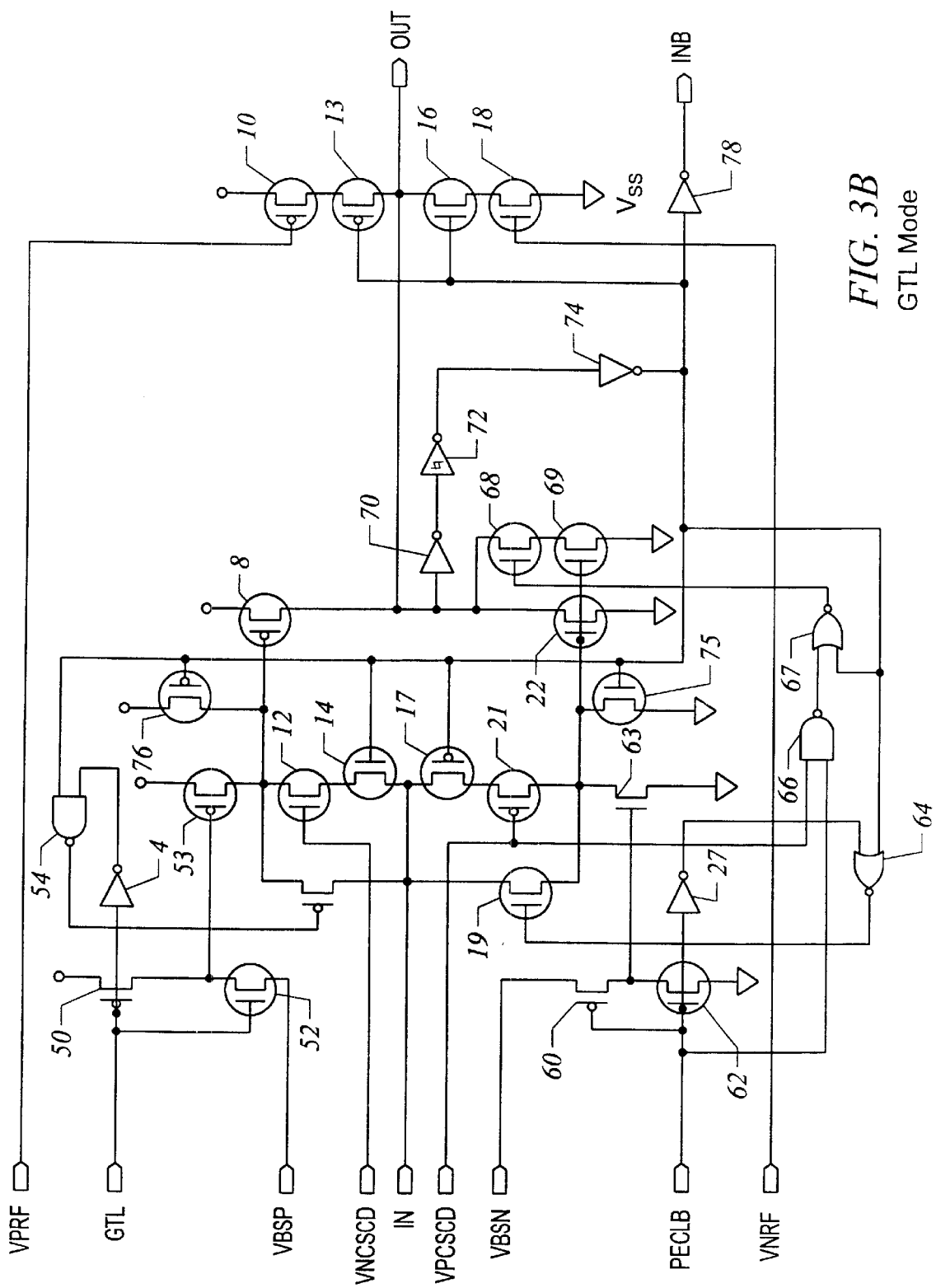
FIG. 3B shows active transistors from FIG. 1B in a GTL mode.

The GTL mode is selected when GTL and PECL are both high. FIG. 3B shows the active transistors in GTL mode.

With PECL high, as in the PCI mode, transistor 60 will be off, and transistor 62 on to turn off transistor 63. Further, the inverter 27 will provide a low output to activate NOR gate 64 and transistor 19 when IN is low and during low to high transitions of IN, as in the PCI mode. Transistors 17 and 21 will further be active to connect the gate of transistor 22 to the input IN when IN is low and during low to high transitions of IN. Similarly, AND gate 66 and NOR gate 67 will activate transistor 68 so that transistors 22 and 69 act together to pull down the output OUT on low to high transitions of IN, as in the PCI mode.

With GTL high, unlike in the PCI mode, transistor 50 turns off and transistor 52 turns on to pull the gate of transistor 53 low. Transistor 53 will, thus, be off. With GTL high, the output of inverter 4 will provide a low signal to the input of NAND gate 54. Irrespective of the second input to NAND gate 54, its output will be high. Transistor 11, will thus be off at all times in the GTL mode. Transistor 14, which has a gate connected to node n16, will be on when IN is high and during a high to low transition of IN, since n16 will be high. With transistor 14 on, the input IN is connected to the gate of transistor 8 through transistors 12 and 14. Current for the transition of IN from high to low initially driving transistor 8 will be somewhat weakened with transistor 11 turned off and only transistors 12 and 14 operative in the GTL mode relative to the PCI mode.

During a low to high transition of the input IN, n16 will be low, turning off transistor 14, effectively cutting off any path from the input IN to the gate of transistor 8. Prior to the low to high transition, with IN low, node n16 will be low turning on transistor 76 to pull up the gate of transistor 8 to turn it off, since any path from the gate of transistor 8 to IN is cut off. Transistor 53 will hold the gate of transistor 8 high after n16 resets to turn transistor 76 off. After the input IN switches to high, n16 will go high turning on transistors 12 and 14 to enable the input IN to keep transistor 8 turned off. Thus, during the low state of IN, and a transition of IN from low to high, the output OUT is held high by the lower GTL voltage and current of transistors 10 and 13, as opposed to the voltage and current created in the PCI mode with transistor 8 on.

Thus, in the GTL mode transistor 22 of the inverter formed by transistors 8 and 22 functions to pull down the output OUT when IN transitions from low to high. After the transition of IN to high, transistor 22 will turn off, and the output will be held low by transistors 16 and 18. But, transistors 10 and 13 function to drive the output OUT when the input IN transitions from high to low without the stronger voltage and current of transistor 8.

3. PECL Mode

PECL mode is selected when GTL and PECL are both low. FIG. 4B shows the active transistors in PECL mode. As with the PCI mode and unlike the GTL mode, with GTL low, transistor 50 will be on, and transistor 52 on to turn off transistor 53. Further, as in the PCI mode, the inverter 4 will provide a high output to activate NAND gate 64 and transistor 11 during high to low transitions of IN. Transistors 14 and 12 will further be active to connect the gate of transistor 8 to the input IN during high to low transitions of IN.

With PECL low, unlike either the PCI or GTL modes, transistor 60 turns on and transistor 62 turns off to pull the gate of transistor 63 high. Transistor 63 will, thus, be on. With PECL low, the output of inverter 27 will provide a high signal to the input of NOR gate 64. Irrespective of the second input to NOR gate 64, its output will be low. Transistor 19, will thus be off at all times in the PECL mode.

Transistor 17, which has a gate connected to node n16, will be on when IN is low, and during a low to high transition of IN, since n16 will be low. With transistor 17 on, the input IN is connected to the gate of transistor 21 through transistors 17 and 21. Current for the transition of IN from low to high driving transistor 22 will be somewhat weakened with transistor 19 turned off and only transistors 12 and 14 operative in the GTL mode relative to the PCI mode.

During a high to low transition of IN, n16 will be high, turning off transistor 17, effectively cutting off any path from the input IN to the gate of transistor 22. Prior to the high to low transition, with IN high, node n16 will be high turning oh transistor 75 to pull down the gate of transistor 22 to turn it off, since any path from the gate of transistor 22 to IN is cut off. Transistor 63 will hold the gate of transistor 22 low after n16 resets to turn transistor 76 off. After the input IN switches to low, n16 will go low turning on transistors 17 and 22 to enable the input IN to keep transistor 22 turned off. Thus, during the high state of IN, and a transition of IN from high to low, the output OUT is held low by the higher PECL voltage and current of transistors 16 and 18, as opposed to the voltage and current created in the PCI and GTL modes with transistor 22 on.

With PECL low, a first input to NAND gate 66 will be low, assuring the output of the NAND gate 66 will be high. With one high input from the output of NAND gate 66, NOR gate 67 will have a low output to turn off transistor 68. With transistor 68 off, transistor 69 will also be off.

Thus, in the PECL mode transistor 8 of the inverter formed by transistors 8 and 22 functions to pull up the output OUT when IN transitions from high to low. After the transition of IN to low, transistor 8 will turn off, and the output will be held low by transistors 16 and 18. But, transistors 16 and 18 function to drive the output OUT when the input IN transitions from high to low without the stronger pull down current and lower voltage of transistor 22.

C. Reference for Input Buffer

Circuitry for providing the reference voltages VNCSCD, VPRF, VNRF and VPCSCD for the input buffer circuits shown in FIGS. 1B–4B are disclosed in U.S. patent application Ser. No. 10/146,769, "filed May 16, 2002, entitled "INPUT BUFFER WITH CMOS DRIVER GATE CURRENT CONTROL ENABLING SELECTABLE PCL, GTL, OR PECL COMPATIBILITY," which was incorporated herein by reference above. Reference is particularly made to FIGS. 5A–5C, and the corresponding description, in this incorporated by reference patent application.

III. Output Buffer

Circuitry for the output buffer in accordance with the present invention is shown in FIG. 6. The output buffer shown includes circuitry to provide sufficient drive strength for large loads, while providing rapid transitioning of the output. The output buffer is also programmable as either push-pull, pull-up only, or pull-down only. The circuitry 900 enclosed in the upper half of FIG. 6 above the PAD node is the pull-up driver while the remaining circuitry 902 in the lower half below the PAD node is the pull-down driver.

The OEB input provides the overall output enable signal, with low indicating enablement. The input signals PUEN and PDEN are pull-up enable and pull-down enable signals, respectively. The PAD is connected to an output pin of the integrated circuit containing the input/output buffer for providing a signal to an external circuit. The input D is the signal which is buffered by the output buffer of FIG. 6 to provide at the PAD.

The pad is driven by a CMOS buffer including a PMOS pull up transistor 111 and an NMOS pull down transistor 143. The PMOS transistor 111 connects a pull up current reference IODD directly to the PAD, while the NMOS transistor 143 connects a pull down current reference IOGND directly to the PAD. Switching circuitry controls the gates of transistors 111 and 143 to drive the PAD with a desired current level to rapidly transition while driving large loads, while enabling rapid transitioning of the PAD.

In output buffer circuit of FIG. 6, the PAD is fed back through the circuit of FIG. 1A to provide a signal at the INB control node. The INB control node, then, provides a delayed transition of the input signal D to control the current on the gates of transistors 111 and 143 to enable transitioning from high to low, or low to high when the PAD is heavily loaded, and then switching slightly after the transition to limit current used to drive the transistors 111 and 143 after the PAD has transitioned to prepare for a rapid subsequent transition. The INB signal is provided to the gate of transistor 141 which has a source to drain path connected in series with transistor 140 to connect VDD to the gate of transistor 143. The INB signal is further provided to the gate of transistor 125 which has a source to drain path connected in series with transistor 129 to connect the gate of transistor 111 to VSS. The gates of transistors 129 and 140 are controlled by the input signal D when the pull up and pull down circuits are enabled, respectively.

Note the enabling circuitry of the pull down portion includes the NOR gate 145 with inputs controlled by the OEB and PDENB signals. The pull down enable portion further includes the inverter 150, pass gates 149 and pull up transistor 144 to control provision of the signal D to node n18. Similarly, the enabling circuitry of the pull up portion includes the NOR gate 126 with inputs controlled by the OEB and PUENB signals. The pull up enable portion further includes the inverter 130, pass gates 131 and pull up transistor 132 to control provision of the signal D to node n8.

In the pull down portion, the signal D is provided to the gate of pull up transistor 140 and pull down transistor 151 which control the node n13 at the gate of transistor 143. An additional pull up transistor 138 and pull down transistor 157 are further included with switching circuitry to assist transistors 140 and 151 in initial pull up or pull down of the gate of transistor 143. The switching of transistors 138 and 157 are controlled by transistor 142, 152, inverters 154 and 155, and NOR gate 156 as described in more detail to follow.

A reference voltage VRFPD is controlled to provide the desired gate voltage to transistor 143 for the desired mode once transistor 143 is turned on sufficiently. The reference voltage VRFPD is provided through a pass gate 148 to the gate of transistor 143. The transistor 143 has a gate controlled by the output of inverter 155 to turn on after the transistor 143 is sufficiently turned on, as described in more detail to follow.

The pull-up circuitry controlling the gate of transistor 111 includes components similar to the pull-down circuitry, but uses high voltage switches for control.

In the pull up portion, the signal D is provided to the gate of pull down transistor 129 and pull up transistor 105 which control the node n3 at the gate of transistor 111. An additional pull down transistor 127 and pull up transistor 117 are further included with switching circuitry to assist transistors 129 and 105 in initial pull up or pull down of the gate of transistor 111 at node n3. The switching of transistor 127 to drive node n3 is controlled by transistors 121 and 122 which have gates controlled by transistor 117 at node n5. The switching of transistor 117 to drive node n3 is controlled by transistors 101 and 109 along with inverters 115,120 and 114,119.

A reference voltage VRFPU is controlled to provide the desired gate voltage to the gate of transistor 111 for the desired mode once transistor 111 is turned on sufficiently. The reference voltage VRFPU is provided through a pass gate 112 to the gate of transistor 111. The gate of pass gate 112 is controlled by the output of inverter 115,120 to turn on after the transistor 111 is sufficiently turned on, as described in more detail to follow. Transistors 113, 123, and 124 assist in pulling node n6 at the gate of pass gate 112 up or down depending on the state of the input D received at node n8.

Added high voltage circuitry in the pull up driver circuitry of FIG. 6 includes transistors 102, 107, 108 and 116. Further, a transistor 118 is used between node n8 coupled to receive the D input, and the node n1 which controls the gate of transistor 105 since transistor 107 is configured to drive node n1.

More details of the operation of the pull-down and pull-up circuitry of the output buffer of FIG. 6 are described in the sections which follow.

A. Pull-Down Driver Operation

1. Off State

Initially, we'll assume the input D is high which will pull node n18 high through pass transistor 149. Node n18 being high will turn on transistor 151 and turn off transistors 138 and 140. Transistor 151 turning on will pull node n13 low to turn off the pull-down driver transistor 143. Node n18 high also drives the output of NOR gate 156 low, and turns on transistor 157 to pull node n16 low.

2. On State

When D goes low, n18 goes low which turns off transistor 151 and turns on transistors 138 and 140. Because n16 was already low, transistor 142 is on so node n13 will be pulled high until cascode transistor 146 pulls node n16 high through transistor 152 to turn off transistor 142. Transistor 142 provides the principal source of pull up current to node n13. Additional current is supplied by transistor 140 through transistor 141 until the gate of transistor 141 which is connected to INB goes high. The signal INB is the output from the output buffer "PAD' which is fed back through the input buffer of FIG. 1A. INB will change states to turn off transistor 141 when the pad voltage crosses the input buffer threshold. When node n16 goes high, the output of inverter 155 will go low to turn on transistor 148 which connects the reference voltage VRFPD to node n13. With the output of inverter 155 low, the output of inverter 154 will be high turning off transistor 152. With transistor 152 off and D being low to turn off transistor 157 and drive the output of NOR gate 156 high, the NOR gate 156 will pull node n16 to VDD.

B. Pull-Up Driver Operation

The pull-up driver works in a similar fashion to the pull-down driver circuit but uses high-voltage switches for control.

1. Off State

Initially the input D is assumed to be low. With D low, node n8 will be pulled low through pass transistors 131 to overcome transistor 118 and pull node n1 low. Node n1 going low turns on transistor 105 to pull up node n3 which turns off the pull up driver transistor 111. Node n1 being low also turns on transistor 106 which pulls node n2 high. Node n2 going high turns off transistor 104. Also transistor 117 is turned on which pulls up node n5 and turns off transistor 116 while turning on transistors 121 and 122. Transistors 121 and 122 being off have no effect until D later transitions to high because transistor 127 is already off with node n8 low. Node n5 being high causes an inverter made of transistors 115 and 120 to drive node n6 low. Node n6 being low turns off transistor 112 and turns on transistor 113 thus latching node n5 high and isolating node n3 from VRFPU. Node n6 being low causes an inverter made of transistors 114 and 119 to drive the gate of transistor 101 high to enable cascode transistor 109 for when D later transitions to high.

2. On State

When the D input goes high node n8 is pulled high through pass-gate transistors 131 and 132 to turn on transistors 127 and 129. Node n8 being high will further push node n1 toward VDD until cascode transistor 118 turns off. As transistors 121 and 122 are already on, nodes n2 and n3 are pulled down which turns on pull-up driver transistor 111. Initially, transistor 121 is opposed by transistor 105, the drive strength of which is already reduced because of node n1 being pushed up. But, as transistor 122 easily overcomes transistor 106, transistor 104 is turned on which pulls node n1 up to the rail thus shutting off transistors 105 and 106. Node n3 is now freely pulled down until its descent is limited by clamp transistor 110. In this way VRGNPU applied to the gate of transistor 110 limits the initial current of driver transistor 111. Simultaneously, cascode transistor 109 through transistor 101 pulls up node n5 which shuts off transistors 121 and 122 and turns on transistor 116 so that the primary pull-down for node n3 is turned off allowing node n3 to raise slightly due to the action of transistor 110. The drive current of transistor 111 is thus regulated until the pad crosses the input buffer threshold which will cause INB to switch low and turn off transistor 125. Transistor 125 which supplied the secondary pull-down for node n3 being off allows node n3 to raise and reduces the drive current of transistor 111, allowing a more ideal graduated drive current during switching. Node n5 going low also causes inverter 115,120 to drive node n6 high which turns transistors 112 and 124 on to latch node n5 low and connects VRFPU to node n3. Also, when node n6 goes high, inverter 114,119 drives node n4 low to shut off transistor 101 and thus cascode transistor 109.

C. Output Buffer with Slew Rate Control

FIG. 7 show modificaions to the output buffer circuit of FIG. 6 to provide slew rate control. FIG. 6 adds to the pull up circuitry 900 an NMOS transistor 910 in parallel with transistor 127, transistor 910 having a drain connected to the drain of transistor 127 and a source connected to VSS. The transistor 910 has a channel width substantially less in size than transistor 127 to carry less current when turned on. Additionally in the pull up circuitry 900, transistor 912 and capacitor 914 are included to connect the source of transistor 127 to VSS. Transistor 912 has a gate connected to the slew rate control input SLEW.

In operation with the slew rate control transistors added to the pull up circuitry 900, with SLEW high indicating a fast slew rate, transistor 912 will turn on to turn transistor 127 on in parallel with transistor 910 to control pull down of node n3 at the gate of pull up control transistor 111 to maximize current drawn from node n3 and rapidly turn off transistor 111. With SLEW low indicating a slow slew rate, transistor 912 will be off, disabling transistor 127. The small sized transistor 910 will, then act alone to pull down node n3 at the gate of transistor 111 to more slowly turn off transistor 111.

FIG. 7 adds to the pull down circuitry 902 a PMOS transistor 922 in parallel with transistor 138, transistor 922 having a drain connected to the drain of transistor 142 and a source connected to VDD. The transistor 922 has a channel substantially less in size than transistor 138 to carry less current when turned on. Additionally in the pull down circuitry 902, transistor 924 and capacitor 926 are included to connect the source of transistor 138 to VDD. Transistor 924 has a gate through an inverter 920 to the slew rate control input SLEW.

In operation with the slew rate control transistors added to the pull down circuitry 902,with SLEW high, transistor 924 will turn on to turn transistor 138 on in parallel with transistor 922 to control pull up of node n13 at the gate of pull down control transistor 143 to maximize current drawn from node n13 and rapidly turn off transistor 143. With SLEW low, transistor 924 will be off, disabling transistor 138. The small sized transistor 922 will, then act alone to pull up node n3 at the gate of transistor 143 to more slowly turn on transistor 111.

D. References for Output Buffer

1. Pull Up Circuit Reference

Figure 8:
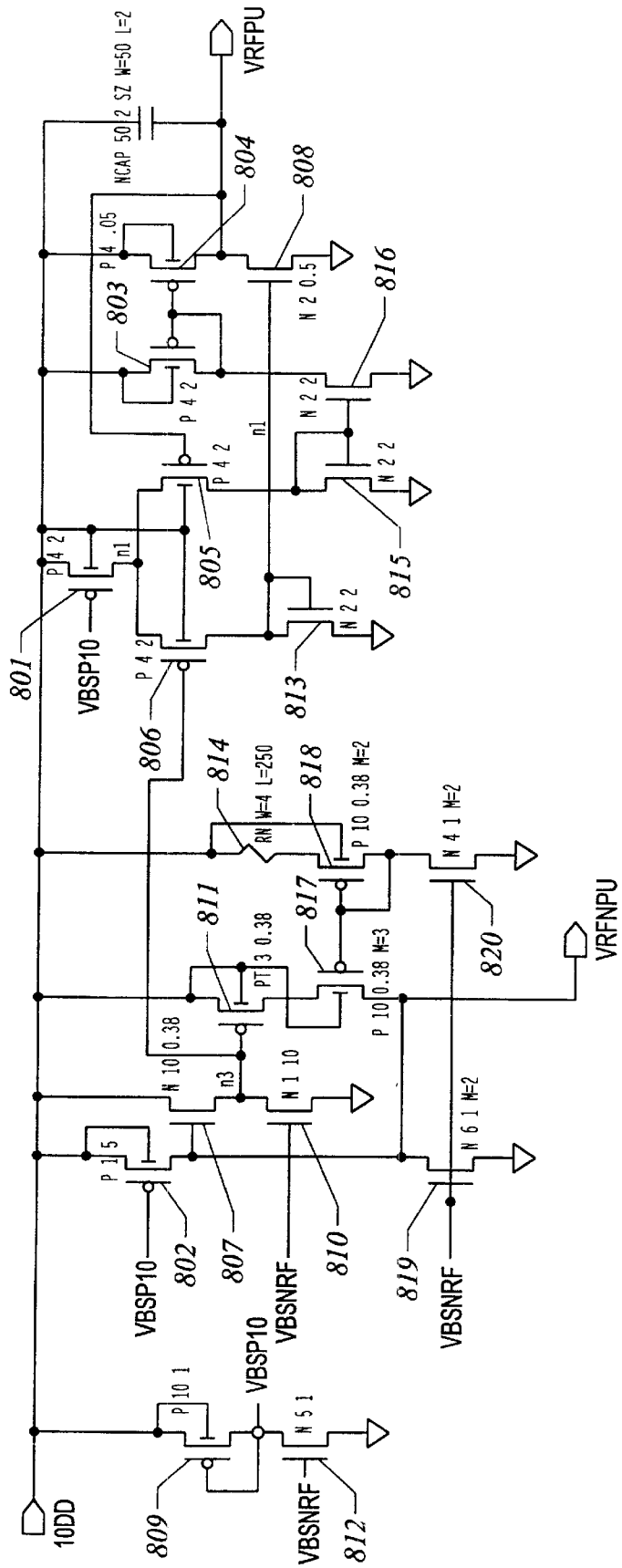
FIG. 8 shows circuitry providing pull up transistor voltage references for the output buffer circuitry of FIG. 6 or 7.

FIG. 8 shows a reference circuit used to generate the references VRFNPU and VRFPU for the output buffer circuit of either FIG. 6 or FIG. 7. The reference VRFNPU is designed to provide significant drive current to pull up driver transistor 111 depending on load conditions during transition of the PAD from high to low, while VRFPU provides minimal drive current once the PAD is transitioned to low to prepare for a subsequent transition back to high.

In FIG. 8, transistor 811 is intended to be a facsimile of the output pull up driver transistor 111 in FIGS. 6 and 7. Transistor 807, then is a facsimile of transistor 110 in FIGS. 6 and 7 which provides current directly from IODD to the gate of transistor 111. Transistor 810 is then a facsimile of transistor 121 of FIGS. 6 and 7.

Transistors 817 and 818 form a differential pair. A resistor 814 is connected between IODD and the source of transistor 818 to create a desired voltage of 0.4 volts below IODD at the source of transistor 818. Thus, if the voltage at the source of transistor 817 is higher than 0.4 volts, the difference will be amplified at the reference VRFNPU to provide significant current at VRFNPU.

FIG. 8 further includes an inverter formed by PMOS transistor 809 and NMOS transitor 812 with the gate of transistor 809 connected to its drain. Transistor 812 receives a voltage reference VBSNRF set to just turn on an NMOS transistor 812 so that only a weak current is drawn. The voltage reference VBSPIO generated at the common drains of transistors 809 and 812 will be an PMOS diode drop from IODD, to minimally turn on the PMOS transistor 809.

The reference VBSPIO is then provided to the gate of transistor 802 in the CMOS transistor pair 802 and 819. The transistor 819 receives the minimal NMOS turn on reference VBSNRF to draw minimal current when VRFNPU is minimal, but receives significant current from transistor 802 otherwise. The common drains of CMOS transistors 802 and 819 are connected to the drain of transistor 807, and to the source of transistor 817. Transistor 820 connects the gate and source of transistor 818 to ground, and receives the minimal bias reference VBSNRF.

Thus, in operation to provide VRFNPU, the circuit of FIG. 8 provides sufficient current to VRFNPU to turn on the gate of transistor 110 in FIGS. 6 and 7 to drive the gate of transistor 111 so that it provides sufficient drive current to the PAD. Should a significant load be on the PAD, the required drive current at the gate of transistor 110 will increase to pull down VRFNPU resulting in the source of transistor 817 providing the necessary current. Although the resistor 814 has a size to create a voltage of 0.4 volts to set the drive current, other values could be used to meet desired design requirements. With the signal VRFNPU driving the gate of transistor 110, which functions to provide current to drive the gate of transistor 111 directly from IODD during high to low output transitions of the PAD, the drive current of transistor 111 will be precisely controlled to be a desired level.

Once the PAD is transitioned to low, the gate of transistor 111 is driven directly from the reference VRFPU to assure transistor 111 remains at a desired minimal drive current to prepare for a subsequent low to high transition. The signal VRFPU is provided from a current mirror formed by transistors 803 and 804. Transistors 803 and 804 are PMOS devices with sources connected to IODD, and gates connected in common to the drain of transistor 803. The drain of transistor 804 forms the reference VRFPU.

The transistor 803 has a drain connected in common with NMOS transistor 808, while the drain of transistor 803 is connected in common with NMOS transistor 816. The sources of transistors 808 and 816 are connected to VSS. Transistor 816 forms a current mirror with transistor 815, while transistor 813 forms a current mirror with transistor 808. Transistor 815 has a drain and gate connected to the drain of a PMOS transistor 805, while transistor 813 has a gate and drain connected to the drain of a PMOS transistor 806. The sources of transistors 813 and 815 are connected to ground. The sources of PMOS transistors 805 and 806 are connected together to the drain of a PMOS transistor 801 which is connected to IODD. The gate of transistor 805 is driven by the reference VRFPU, while the gate of transistor 806 is driven by the source of transistor 807.

In operation, the transistors 805, 806, 813, and 815 are designed to draw the minimal drive current necessary, so transistors 816, 808, 803 and 804 which control VRFPU will provide a minimum drive current to VRFPU. Transistor 807 functions as a facsimile of transistor 110, and during the final phase of transition of the PAD from high to low will control the drive current for transistor 110. Accordingly, with the drain of transistor 807 driving transistor 806, transistor 813 will assure transistor 808 which is connected in a current mirror configuration with transistor 807 provides the minimal drive current. Once transistor 110 is off, the minimum drive current to assure transistor VRFPU provides the desired drive current for transistor 111 will be controlled by transistor 805 which is also connected to VRFPU. With transistor 805 providing current to transistor 815, and transistor 815 being connected in a current mirror configuration with transistor 816 which controls current in transistor 803, and transistor 803 being in a current mirror configuration with transistor 804, VRFPU will be controlled to assure sufficient current is provided to turn off VRFPU.

2. Pull Down Circuit Reference

Figure 9:
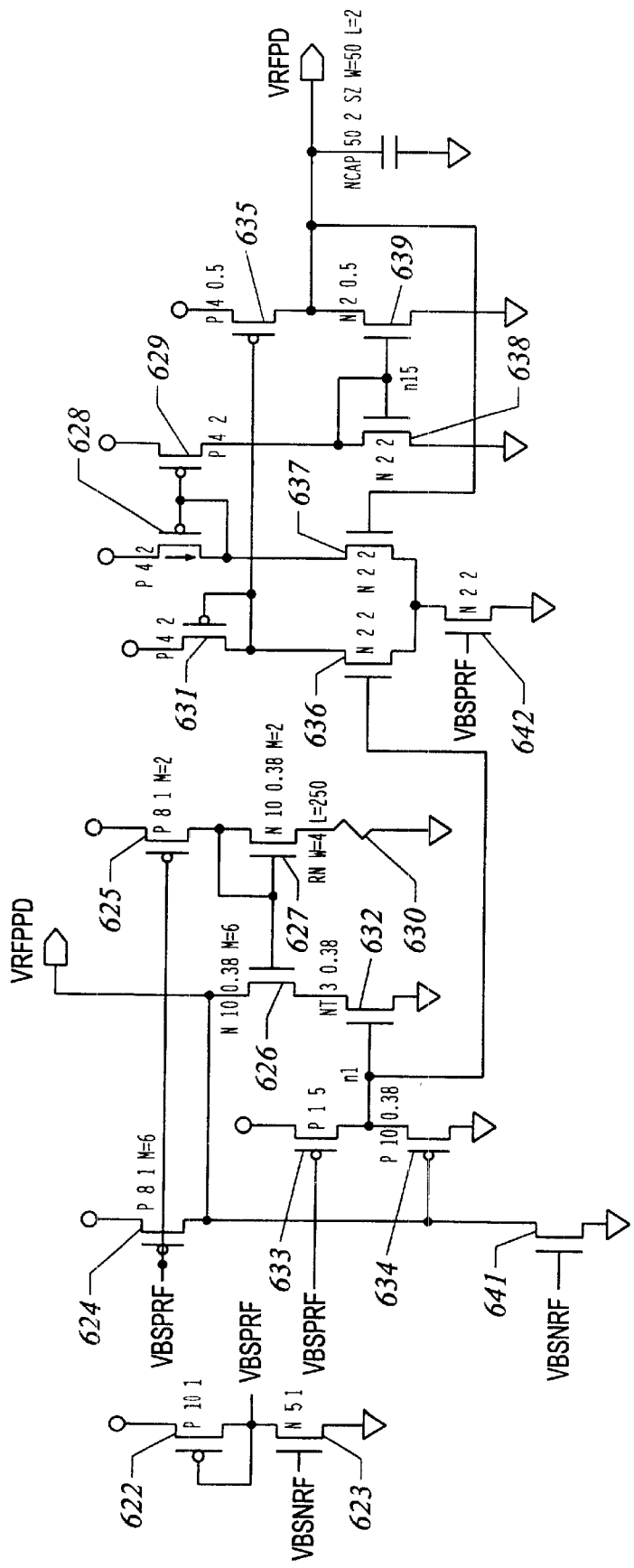
FIG. 9 shows circuitry providing pull down transistor voltage references for the output buffer circuitry of FIG. 6 and 7.

FIG. 9 shows a reference circuit used to generate the references VRFPPD and VRPPD for the output buffer circuit of either FIG. 6 or FIG. 7. The reference VRFPPD is designed to provide significant drive current to output drive pull down transistor 143 depending on load conditions during transition of the PAD from low to high, while VRFPD provides minimal drive current once the PAD is transitioned to low to prepare for a subsequent transition back high. The pull down reference circuitry for VRFPPD and VRFPD provides a complementary but similar function to the circuitry creating the pull up references VRFPU and VRFNPU descrived to follow.

In FIG. 9, transistor 632 is intended to be a facsimile of the output pull down driver transistor 143 in FIGS. 6 and 7. Transistor 634, then is a facsimile of transistor 147 in FIGS. 6 and 7 which provides current directly to VSS or IOGND from the gate of transistor 143. Transistor 633 is then a facsimile of transistor 142 of FIGS. 6 and 7.

Transistors 626 and 627 form a differential pair. A resistor 630 is connected between VSS or IOGND and the source of transistor 627 to create a desired voltage of 0.4 volts above IOGND at the source of transistor 627. Thus, if the voltage at the source of transistor 626 is lower than 0.4 volts, the difference will be amplified at the reference VRFPPD to provide significant current at VRFPPD.

FIG. 9 further includes an inverter formed by PMOS transistor 622 and NMOS transistor 623, with the gate of transistor 622 connected to its drain. Transistor 623 receives a voltage reference VBSNRF set to just turn on an NMOS transistor 623 so that only a weak current is drawn. The voltage reference VBSPRF generated at the common drains of transistors 622 and 623 will enable transistor 622 to turn on minimally to provide a 1 vt PMOS diode drop from IODD, to minimally turn on a PMOS transistor 623.

The reference VBSPRF is then provided to the gate of transistor 641 in the CMOS transistor pair 641 and 633. The voltage VRBPRF is a minimal NMOS turn on reference causing an NMOS transistor to turn on to draw minimal current. The minimal current drawn enables a weak bias reference current to be provided to draw minimal power in operation. The common drains of CMOS transistors 641 and 624 are connected to the drain of transistor 634, and to the source of transistor 626. Transistor 625 connects the gate and source of transistor 627 to IODD, and receives the bias reference VBSPRF, along with transistor 624, enabling transistors 624 and 625 to each provide a 1 vt voltage drop from IODD.

Thus, in operation to provide VRFPPD, the circuit of FIG. 9 provides sufficient current to VRFPPD to turn on the gate of transistor 147 in FIGS. 6 and 7 to drive the gate of transistor 143 so that it provides sufficient drive current to the PAD. Should a significant load be on the PAD, the required drive current at the gate of transistor 147 will increase to pull up VRFPPD resulting in the source of transistor 626 providing the necessary current. Although the resistor 630 has a size to create a voltage of 0.4 volts to set the drive current, other values could be used to meet desired design requirements. With the signal VRFPPD driving the gate of transistor 147, which functions to provide current to drive the gate of transistor 143 directly from IOGND during low to high output transitions of the PAD, the drive current of transistor 143 will be precisely controlled to be a desired level.

Once the PAD is transitioned to high, the gate of transistor 143 is driven directly from the reference VRFPD to assure transistor 143 remains off with a weaker drive current to prepare for a subsequent low to high transition. The signal VRFPD is provided from a current mirror formed by transistors 638 and 639. Transistors 638 and 639 are NMOS devices with sources connected to VSS, and gates connected in common to the drain of transistor 638. The drain of transistor 639 forms the reference VRFPD.

The transistor 638 has a drain connected in common with PMOS transistor 629, while the drain of transistor 639 is connected in common with PMOS transistor 635. The sources of transistors 638 and 639 are connected to VDD. Transistor 629 forms a current mirror with transistor 628, while transistor 635 forms a current mirror with transistor 631. Transistor 628 has a drain and gate connected to the drain of a NMOS transistor 637, while transistor 631 has a gate and drain connected to the drain of a NMOS transistor 636. The sources of transistors 628 and 631 are connected to VSS. The sources of NMOS transistors 636 and 637 are connected together to the drain of a PMOS transistor 642 which is connected to VSS. The gate of transistor 637 is driven by the reference VRFPD, while the gate of transistor 636 is driven by the source of transistor 633.

In operation, the transistors 636, 637, 628, and 631 are designed to draw the minimal drive current necessary, so transistors 629, 635, 638 and 639 which control VRFPD will provide a minimum drive current to VRFPD. Transistor 633 functions as a facsimile of transistor 147, and during the final phase of transition of the PAD from low to high will control the minimal drive current for transistor 147. Accordingly, with the drain of transistor 633 driving transistor 636, transistor 631 will assure transistor 635 which is connected in a current mirror configuration with transistor 631 provides the minimal drive current. Once transistor 147 is off, the minimum drive current to assure transistor VRFPD turns off transistor 143 will be controlled by the minimum current to turn off transistor 637 which is also connected to VRFPD. With transistor 637 providing current from transistor 628, and transistor 628 being connected in a current mirror configuration with transistor 629 which controls current in transistor 638, and transistor 638 being in a current mirror configuration with transistor 639, VRFPD will be controlled to assure sufficient current is provided to turn off VRFPD.

IV. ESD Protection and Clamp Circuit for I/O Buffer

1. ESD Protection Circuitry

Figure 10:
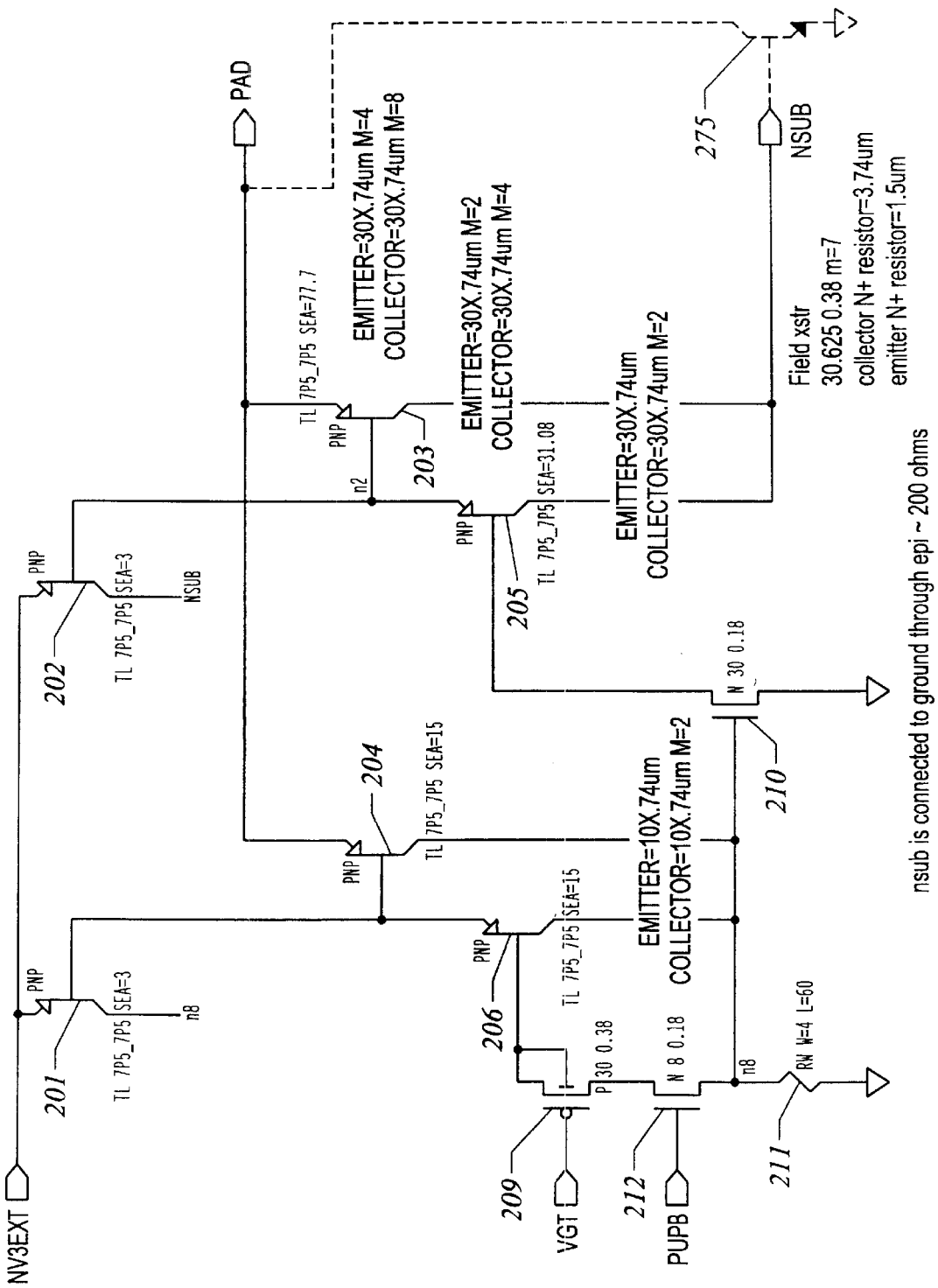
FIG. 10 shows circuitry for clamping the pad voltage.

FIG. 10 shows circuitry connected to the PAD to provide ESD protection and to clamp the output at a maximum voltage to prevent transistor damage. The ESD protection circuitry shown is a modification of circuitry described in U.S. Pat. No. 6,028,758 entitled "Electrostatic Discharge (ESD) Protection For A 5.0 Volt Compatible Inout/Output (I/O) In A 2.5 Volt Semiconductor Process", with inventor Bradley A. Sharpe-Geisler, which is incorporated herein by reference. The circuitry of FIG. 10 includes a lateral BJT 275 (shown in dashed lines) formed using the substrate, the BJT 275 being an NPN transistor. With the transistor 275 being a BJT, it will have no gate oxide, unlike CMOS devices. For example, for a 2.5 volt CMOS device, the gate oxide for CMOS transistors can only handle approximately 3.0 volts while the BJT can handle significantly more.

The structure of the lateral BJT 275 is provided in a p-epitaxial layer in a p+ substrate. The p+ substrate is heavily doped to provide a 0.1 Ω-cm resistivity and is approximately 600 µm thick, while the p– epitaxial layer is approximately 7 µm thick, and is lightly doped to provide about a 10 Ω-cm resistivity. The lateral BJT 275 is formed by n+ implant regions in the p– epitaxial layer along with a p+ implant region. The n+ region forms an emitter region for the lateral BJT and is connected to ground, while the n+ region forms a collector region connected to the pad. The p+ implant region connects to a contact node NSUB and forms a base region for the BJT.

With the pad being coupled to node NSUB, during an ESD event when a large voltage is applied between the pad and a ground pin, node NSUB will pull up the p– epitaxial region to turn on the lateral BJT. Similar to gate aided breakdown, with the NPN BJT transistor turning on, the pad will be connected to ground.

2. Circuitry to Clamp Pad Voltage

The ESD protection circuitry further includes circuitry to clamp the pad voltage below a desired maximum value during an ESD event to prevent damage to other transistors connected to the pad, as well as to prevent turn on of the ESD protection circuit during normal operation. Circuitry to clamp the pad voltage during an ESD event includes BJTs 203, 204, 205, and 206, NMOS transistor 210 and resistor 211. Circuitry to clamp the pad voltage during normal operation includes BJT transistors 204, 206, 209, 212, and the resistor 211 along with additional transistors 201, 202 and 204.

The BJTs 203 and 205 are PNP type transistors forming a Darlington pair. A Darlington pair offers a low emitter impedance since the transistors 203 and 205 are connected as emitter followers with the emitter of 205 connected to the base of 203. With the emitter of transistor 203 connected to the pad, a low impedance path is offered from the pad to node NSUB to carry the potentially high ESD current without a correspondingly high voltage increase. Further, PNP BJTs 203 and 205 are used in the path between the pad and ground because they do not have a gate oxide which can be damaged by a potentially high ESD voltage.

The base of BJT 205 is driven in an ESD event by NMOS transistor 210. The gate of NMOS transistor 210 and 211 is connected to the collector of PNP BJT transistors 204 and 206 connected in an emitter follower configuration similar to BJT transistors 203 and 205. The BJT transistors 204 and 206 have emitters connected to the pad, so during an ESD event, like the transistors 203 and 205, offer a path from the pad to node n8. Resistor 211 separates node n8 from ground, allowing node n8 to be pulled up during an ESD event to turn on transistor 210. During an ESD event with the power to the chip off, VGT and PUPB will be at ground. Transistor 209 connected to the base of transistor 206 will be on, but transistor 212 will be off.

In operation during an ESD event transistors 204 and 206 will connect the pad to node n8. Node n8 will then charge up to turn on NMOS transistor 210. An NMOS 1 vt diode drop of approximately 0.7 volts will then be applied across transistor 210, along with another 1 vt diode drop of approximately 0.7 volts from the base to emitter of each of BJT transistors 203 and 205. The total voltage on the pad will then be clamped at 3 vt, or approximately 2.1 volts.

A control voltage VGT clamps the maximum voltage on the pad during normal operation when an ESD event is not occurring. By setting VGT, the transistor 209 will turn on to connect the pad through resistor 211 when the pad exceeds a maximum voltage. After start up, the pull up voltage PUPB will be high turning on transistor 212 to connect transistor 209 and 211. The pad voltage will then be a total of a 1 vt diode drop for each of transistors 204, 206, 209 plus the VGT voltage. Thus, for example with 1.0 volts provided as VGT, the maximum voltage on the pad will be 3 vt+1.0 volts, totalling 2.1 volts+1.0 volts=3.1 volts.

To further optimize the operation of the clamp circuit of FIG. 10, BJT transistors 201 and 202 are optionally included. The transistor 201 serves to limit the capacitance between the base of transistor 203 and emitter of the transistor 202. The transistor 202 has an emitter connected to NV3EXT which is the 3.3 volt pin connection. When transistor 202 turns on during an ESD event, the node NV3EXT can be pulled up to 3.3 volts. Transistor 202 will then provide a 1 vt drop from the NV3 node to pull the base of transistor 203 to 2.6 volts. When an ESD event occurs and the base of transistor 203 is at 0 volts, when the pad is pulled high the base-emitter diode of transistor 203 will forward bias until the base of 203 is pulled up. The capacitance on the base of transistor 202 shows up in the emitter load current as the base capacitance multiplied by the gain of transistor 202. The base of transistor 202 will be formed so that its capacitance will be a large n-well capacitance. If the collector of transistor 205 is grounded, its base capacitance will show up at its emitter multiplied by its gain. The capacitance at the emitters of transistors 202 and 205 then add up to provide a considerable amount of gain. Once the base of transistor 203 is pulled up to 1 vt below 3.3 volts by transistor 202, the capacitance described no longer shows up. Transistor 201 provides a similar function of capacitance reduction for transistor 204.

3. Clamp Reference Circuit

Figure 11:
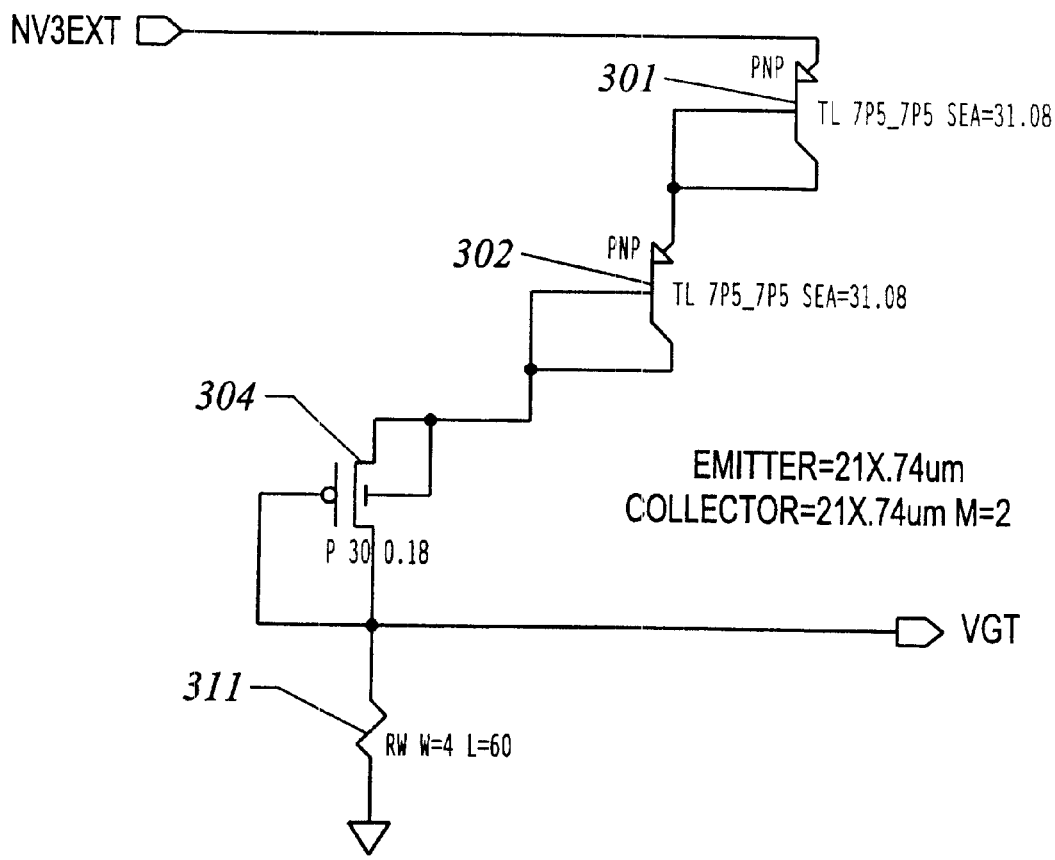
FIG. 11 shows circuitry for providing a reference to the clamping circuit of FIG. 10.

FIG. 11 shows circuitry for a clamp reference designed to provide the reference voltage VGT. The circuit of FIG. 11 uses three transistors 301, 302 and 304 to set the voltage VGT. Transistor 301 is connected to a 3.3 volt pin connection NV3EST in a diode fashion to provide a 1 vt drop from NV3EST to transistor 302. Transistor 302 is similarly set to provide a 1 vt drop to transistor 304, and transistor 304 is set to provide another 1 vt drop to a resistor 311. The voltage provided at VGT then is NV3EST minus 3 vt, or 3.3–2.1 volts or 0.7 volts.

V. Overall I/O Buffer Block Diagram

Figure 12A:
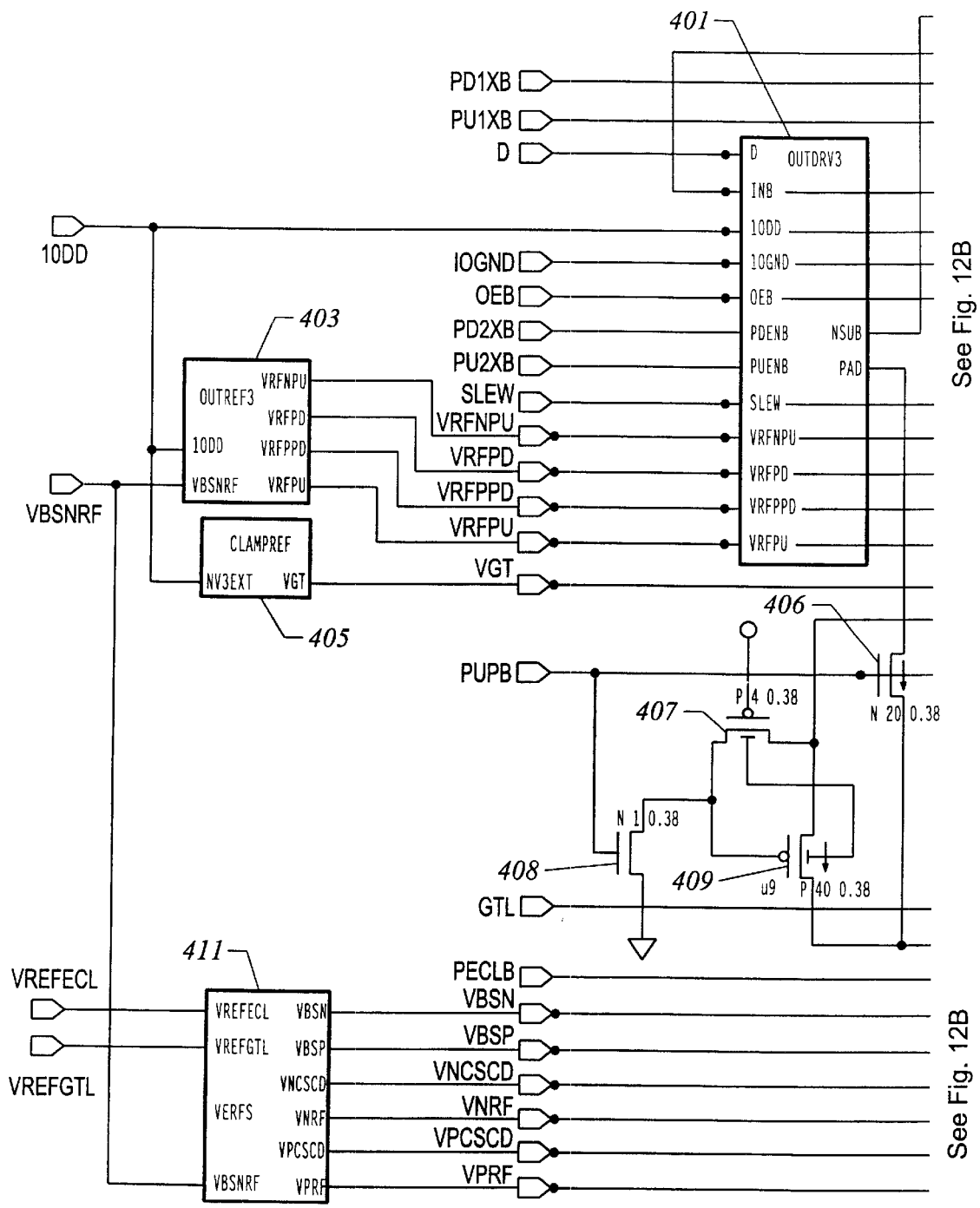
FIGS. 12A & 12B shows an overall block diagram for the I/O buffer in accordance with the present invention.
Figure 12B:
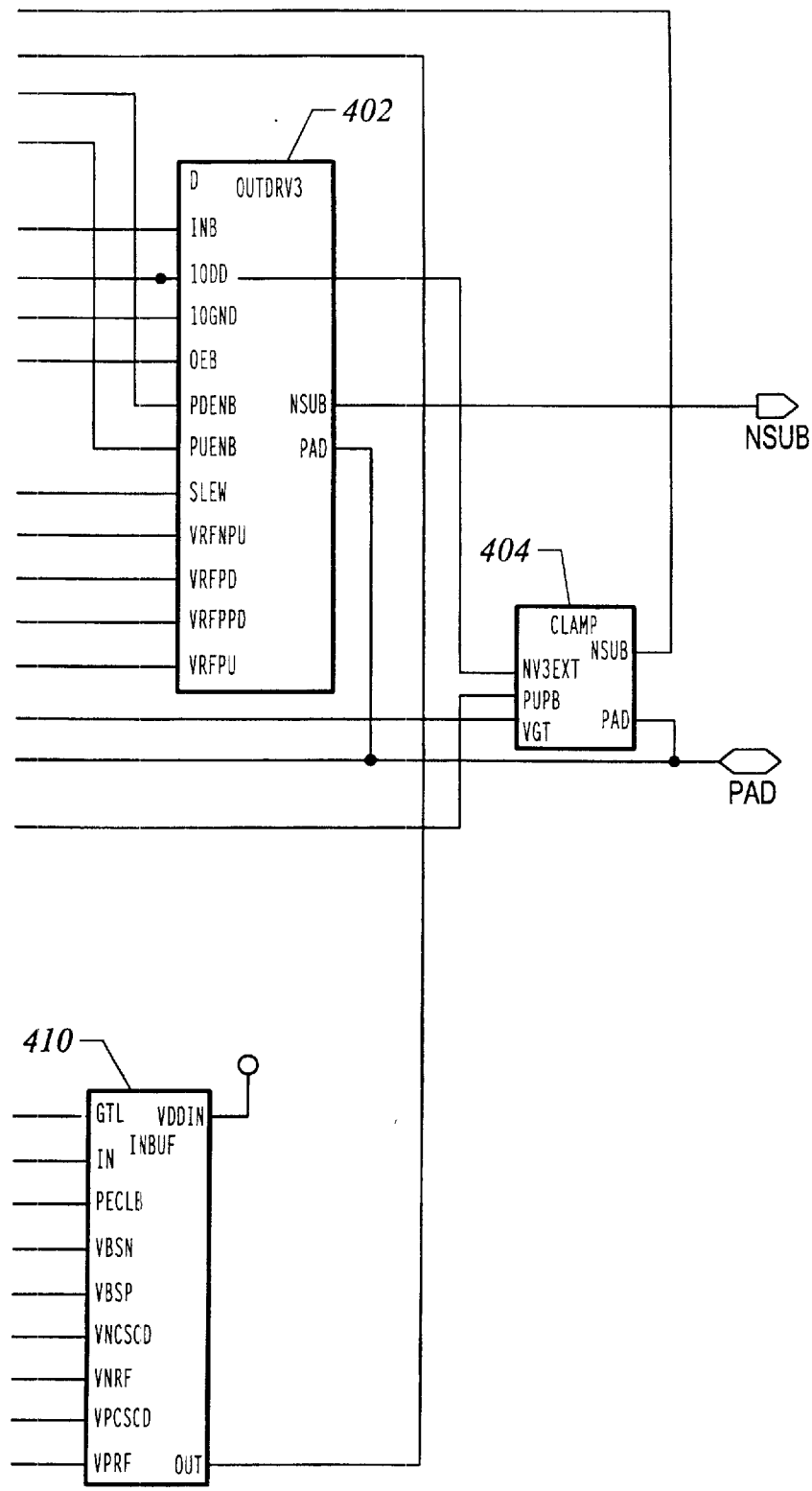

FIG. 12 shows a block diagram for components of an I/O buffer system in accordance with the present invention. The block diagram shows an arrangement of components such as that described and shown in FIGS. 1–11.

The circuit of FIG. 12 includes an input buffer 410 with structure as shown in FIG. 1A. The input buffer 410 receives a GTL input signal and a PECLB signal input to the I/O buffer. Reference inputs PECLB, VBSN, VBSP, VNCSCD, VNRF, VPCSCD and VPRF are provided from the reference circuit 411 having components as shown in FIG. 5. The reference circuit 411 receives VBSNRF, VREFECL and VREFGTL signals input to the I/O buffer. The PAD is connected through a transistor 409 to the input IN of the input buffer circuit 410, VDD is provided from the I/O buffer to the VDDIN connection, and the circuit 410 provides an output OUT.

The output OUT of input buffer 10 is provided to the INB input of output buffer circuits 401 and 402. The circuits 401 and 402 each have circuitry as shown in FIG. 7. The data input D is provided to the D input of the output buffer circuits 401 and 402 as is the current supply IODD and ground IOGND. The substrate connection NSUB is provided from the circuits 401 and 402 along with a PAD connection. A first set of pull up and pull down enable signals PU1XB and PD1XB are provided to the first output buffer circuit 402, while a second set of signals PU2XB and PD2XB are provided to output buffer circuit 401. A common output enable signal OEB and slew rate control signal SLEW are provided as inputs to the circuits 401 and 402. The output buffer circuits 401 and 402 further receive reference circuit signals VRFNPU, VRFPPD, VRFPD and VRFPU from circuit 403. Circuitry making up 403 is shown in FIGS. 8 and 9. The circuit 403 receives inputs from the current supply IODD and reference VBSNRF.

Circuitry 404 is provided to clamp the pad voltage for ESD protection as well as overvoltage protection. Details of the clamp circuitry 404 are shown in FIG. 10. The current supply to the circuit IODD is provided to drive the NV3EXT 3.3 volt input of the clamp circuitry 404. The VGT reference is provided from clamp reference circuit 405. Details of the clamp reference circuitry 405 is shown in FIG. 11. The NV3EXT reference connection of the clamp reference circuit 405 is connected to the IODD current supply input.

Power up control circuitry is provided to prevent a connection from between (1) the actual PAD and PAD outputs of output buffer circuits 401 and 402 and (2) the input IN of the input buffer circuit during startup to prevent instability. During startup PUPB is a low signal applied to the gates of transistors 406 and 408. Note that PUPB is further applied directly to the PUPB input of the clamp circuit 404. Transistor 406 connecting the actual PAD and the pad outputs of circuits 401 and 402 to the input IN of circuit 410 will be off. Likewise transistor 408 will be off disconnecting the connection of the gate of transistor 409 and drain of transistor 407 from ground. Transistor 407 is connected to Vcc, turning it off during power up once Vcc is provided to the entire circuit. Transistor 409 connects the actual PAD and PAD connections of transistors 401 and 402 to the input IN of input buffer 410, and with 408 removing any ground connection, the voltage on the gate of 409 will be either equal to or lower than the voltage on its source, keeping it set to the initial PAD state and increasing the voltage on the IN input of 410 after Vcd comes on if the PAD voltage goes high. After power up, PUPB goes high to turn on transistor 406 to connect the input IN of 410 to the PAD connections of 401 and 402. Transistor 408 will turn on to pull the gate of 409 low to further assure the connection between the input IN of 410 to the PAD connections of 401 and 402 and to the actual PAD output for normal operation.

Although the present invention has been described above with particularity, this was merely to teach one of ordinary skill in the art how to make and use the invention. Many additional modifications will fall within the scope of the invention, as that scope is defined by the claims which follow.

What is claimed is:

1. A buffer comprising:
   an output signal node for receiving a signal to be provided to an external circuit;
   an output pad for connecting to the external circuit;
   an input buffer having an input coupled to the output pad, and an output providing a signal in a mode programmably selected from a group consisting of a PCL mode, a PCI mode and a GTL mode; and
   an output buffer comprising:
      a driver transistor having a source-drain path coupling the output pad to a first power supply terminal, and having a gate forming a first node; and
      a current switching means for providing current to the gate of the driver transistor at a first level when the signal provided to the output of the input buffer is in a first state, and providing current to the gate of the driver transistor at a second level when the signal provided to the output of the input buffer is in a second state.

2. The buffer of claim 1, wherein the current switching means comprises:
   a first transistor having a source-drain path coupling the first node to a second power supply terminal, and having a gate coupled to the output signal node;
   a second transistor having a source-drain path coupling the first node to the second power supply terminal, and having a gate coupled to the output signal node; and
   a third transistor having a source-drain path coupling the source-drain path of the second transistor to the first node, and having a gate coupled to the output of the input buffer.

3. The buffer of claim 1, wherein the current switching means of the output buffer further comprises:
   a voltage reference for supplying a first reference signal at a first reference signal node, and a second voltage reference signal at a second reference signal node;
   a gating transistor having a source-drain path coupling the second voltage reference signal node to the first node, and having a gate;
   a logic gate connecting the output signal node to the gate of the gating transistor; and
   a first switching transistor having a source-drain path coupling the first power supply terminal to the first node and having a gate connected to the first voltage reference signal node.

4. The buffer of claim 3, wherein the voltage reference comprises:
   a driver replicating transistor having a source-drain path with a first terminal connected to the first power supply terminal, and having a gate coupled to the second reference signal node;
   a resistor having a first terminal connected to the first power supply terminal, and having a second terminal;
   a current mirror having a first leg connected to the second terminal of the resistor, and having a second leg connected to the second end of the driver replicating transistor;
   a reference pull up transistor having a source-drain path coupling the first power supply terminal to the second reference signal node, and having a gate connected to the first voltage reference node; and
   a reference pull down transistor having a source-drain path coupling the second power supply terminal to the second reference signal node, and having a gate connected to the first voltage reference node.

5. The buffer of claim 4 wherein the current switching means further comprises:
   a first transistor having a source-drain path coupling the first node to the first power supply terminal, and having a gate coupled to a second node; and
   a second transistor having a source-drain path coupling the output signal node to the second node, and having a gate coupled to the first voltage supply terminal.

6. A buffer comprising:
an output signal node for receiving a data signal to be provided to an external circuit;
an output pad for connecting to the external circuit;
an input buffer having an input coupled to the output pad, and an output providing a signal in a mode programmably selected from a group consisting of a PCL mode, a PCI mode and a GTL mode; and
an output buffer comprising:
   a PMOS pull up transistor having a drain coupled to the output pad, a source coupled to a first power supply terminal, and having a gate forming a first node; and
   a pull up switching circuit comprising:
      a first NMOS transistor having a source-drain path coupling the first node to a second power supply terminal, and having a gate coupled to the output signal node;
      a second NMOS transistor having a source-drain path coupling the first node to the second power supply terminal, and having a gate coupled to the output signal node; and
      a third NMOS transistor having a source-drain path coupling the source-drain path of the second NMOS transistor to the first node, and having a gate coupled to the output of the input buffer.

7. The buffer of claim 6, wherein the pull up switching circuit of the output buffer further comprises:
a voltage reference for supplying a first pull-up reference signal at a first pull-up reference signal node, and a second pull-down reference signal at a pull-up reference signal node;
a gating transistor having a source-drain path coupling the second pull-up reference signal node to the first node, and having a gate;
a logic gate connecting the output signal node to the gate of the gating transistor; and
a first pull up switch transistor having a source-drain path coupling the first power supply terminal to the first node and having a gate connected to receive the first pull-up voltage reference signal.

8. The buffer of claim 7, wherein the voltage reference comprises:
a PMOS pull-up replicating transistor having a source connected to the first power supply terminal, and having a gate coupled to the second pull-up reference signal node;
a resistor having a first terminal connected to the first power supply terminal, and having a second terminal;
a current mirror having a first leg connected to the second terminal of the resistor, and having a second leg connected to the drain of the PMOS pull-up replicating transistor;
a VRFPU pull up transistor having a source-drain path coupling the first power supply terminal to the second pull-up reference signal node, and having a gate connected to a first voltage reference; and
a VRFPU pull down transistor having a source-drain path coupling the second power supply terminal to the second pull-up reference signal node, and having a gate connected to a second voltage reference.

9. The buffer of claim 6 wherein the pull-up switching circuit further comprises:
a first PMOS transistor having a drain coupled to the first node, a source coupled to the first power supply terminal, and having a gate coupled to a second node; and
a second PMOS transistor having a source to drain path coupling the output signal node to the second node, and having a gate coupled to the first voltage supply reference.

10. A buffer comprising:
an output signal node for receiving a signal to be provided to an external circuit;
an output pad for connecting to the external circuit;
an input buffer having an input coupled to the output pad, and an output providing a signal in a mode programmably selected from a group consisting of a PCL mode, a PCI mode and a GTL mode; and
an output buffer comprising:
   a PMOS pull down transistor having a drain coupled to the output pad, a source coupled to a first power supply terminal, and having a gate forming a first node; and
   a pull down switching circuit comprising:
      a first PMOS transistor having a source-drain path coupling the first node to a second power supply terminal, and having a gate coupled to the output signal node;
      a second PMOS transistor having a source-drain path coupling the first node to the second power supply terminal, and having a gate coupled to the output signal node; and
      a third PMOS transistor having a source-drain path coupling the source-drain path of the second PMOS transistor to the first node, and having a gate coupled to the output of the input buffer.

11. The buffer of claim 10, wherein the pull down switching circuit of the output buffer further comprises:
a voltage reference for supplying a first pull-down reference signal at a first pull-down reference node, and a second pull-down reference signal at a second pull-down reference signal node;
a gating transistor having a source-drain path coupling the second pull-down reference signal node to the first node, and having a gate;
a logic gate connecting the output signal node to the gate of the gating transistor; and
a first pull down switch transistor having a source-drain path coupling the first power supply terminal to the first node and having a gate connected to receive the first pull-down voltage reference signal.

12. The buffer of claim 10, wherein the voltage reference comprises:
a PMOS pull-down replicating transistor having a source connected to the first power supply terminal, and having a gate coupled to the second pull-down reference signal node;
a resistor having a first terminal connected to the first power supply terminal, and having a second terminal;
a current mirror having a first leg connected to the second terminal of the resistor, and having a second leg connected to the drain of the PMOS pull-down replicating transistor;
a VRFPU pull down transistor having a source-drain path coupling the first power supply terminal to the second pull-down reference signal node, and having a gate connected to a first voltage reference; and
a VRFPU pull up transistor having a source-drain path coupling the second power supply terminal to the second pull-up reference signal node, and having a gate connected to a second voltage reference.

13. The buffer of claim 10 wherein the logic gate comprises:
- a first NMOS transistor having a drain coupled to the first node, a source coupled to the second power supply terminal, and having a gate coupled to the output signal node;
- a first inverter having an input forming a second node coupled to the drain of the first NMOS transistor, and an output coupled to the gate of the gating transistor;
- a fourth PMOS transistor having a source coupled to the first node, a drain, and a gate coupled to the first pull-down voltage reference;
- a fifth PMOS transistor having a source coupled to the drain of the fourth PMOS transistor, a drain coupled to the second node, and having a gate;
- a second inverter coupling the output of the first inverter to the gate of the fifth PMOS transistor; and
- a NOR gate having a first input coupled to the output signal node, a second input coupled to the output of the first inverter, and an output coupled to the second node.

14. The buffer of claim 13, wherein the pull down switching circuitry further comprises:
- a sixth PMOS transistor having a source coupled to the first power supply terminal, a drain, and having a gate coupled to the output signal node;
- an seventh PMOS transistor having a source coupled to the drain of the sixth PMOS transistor, a drain coupled to the first node, and a gate coupled to the second node; and
- a second NMOS transistor having a drain coupled to the first node, a source coupled to the first power supply terminal, and having a gate coupled to the output signal node.

* * * * *